United States Patent
Ice

(10) Patent No.: US 7,167,380 B2
(45) Date of Patent: Jan. 23, 2007

(54) CARD CAGE SYSTEM

(75) Inventor: Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 32 days.

(21) Appl. No.: 10/638,981

(22) Filed: Aug. 12, 2003

(65) Prior Publication Data

US 2004/0037054 A1  Feb. 26, 2004

Related U.S. Application Data

(60) Provisional application No. 60/422,703, filed on Oct. 31, 2002, provisional application No. 60/403,342, filed on Aug. 13, 2002.

(51) Int. Cl.
*H05K 7/14* (2006.01)
*H05K 7/18* (2006.01)

(52) U.S. Cl. .............. 361/796; 361/756; 361/727; 361/760; 361/730; 439/377

(58) Field of Classification Search ........... 361/752, 361/797, 800, 796, 756, 727, 741, 686, 802, 361/790, 683–684, 760, 730; 439/377; 211/41.17
See application file for complete search history.

(56) References Cited

U.S. PATENT DOCUMENTS

| | | |
|---|---|---|
| 3,533,045 A | 10/1970 | Henschen |
| 3,733,523 A | 5/1973 | Reynolds et al. |
| 4,068,290 A | 1/1978 | Wetherbee |
| 4,241,381 A | 12/1980 | Cobaugh |
| 4,327,835 A | 5/1982 | Leger |
| 4,546,414 A | 10/1985 | Donges |
| 4,869,672 A | 9/1989 | Andrews |
| 4,964,810 A | 10/1990 | Malotke et al. |
| 5,052,936 A | 10/1991 | Biechler et al. |
| 5,163,847 A | 11/1992 | Regnier |
| 5,175,669 A * | 12/1992 | Navia et al. ............ 361/683 |
| 5,211,568 A | 5/1993 | Yamada et al. |
| 5,387,132 A | 2/1995 | Sarver et al. |
| 5,394,305 A | 2/1995 | Moral et al. |
| 5,642,264 A | 6/1997 | Cantrell |

(Continued)

OTHER PUBLICATIONS

U.S. Appl. No. 10/639,064, filed Aug. 12, 2003, Ice.

(Continued)

*Primary Examiner*—Kamand Cuneo
*Assistant Examiner*—Hung S. Bui
(74) *Attorney, Agent, or Firm*—Workman Nydegger

(57) ABSTRACT

A card cage system is provided that includes a middle card guide interposed between two end card guides in an electronic equipment enclosure. Each of the card guides includes one or more channels adapted to receive a card edge. The middle card guide includes a removable adapter element that, when present in the middle card guide, prevents insertion of double wide, or larger, cards while, at the same time, permitting insertion of two single wide cards in a side-by-side arrangement. When the adapter element is removed, a double-wide card can be received in the middle card guide such that it straddles the middle card guide. The edges of the double-wide card are received in the first and second end card guides. Thus, the card guide can be readily customized to accommodate a variety of card types and sizes, in various arrangements.

44 Claims, 13 Drawing Sheets

U.S. PATENT DOCUMENTS

| | | |
|---|---|---|
| 5,666,271 A | 9/1997 | Kim et al. |
| 5,715,669 A | 2/1998 | Hasegawa et al. |
| 5,769,668 A | 6/1998 | Tondreault |
| 5,808,866 A | 9/1998 | Porter |
| 5,872,701 A | 2/1999 | Hayden, et al. |
| 5,912,799 A | 6/1999 | Grouell et al. |
| 6,008,995 A * | 12/1999 | Pusateri et al. ............. 361/796 |
| 6,030,230 A | 2/2000 | Peacock |
| 6,038,126 A | 3/2000 | Weng |
| 6,166,917 A | 12/2000 | Anderson |
| 6,195,262 B1 | 2/2001 | Bodette et al. |
| 6,198,633 B1 * | 3/2001 | Lehman et al. ............. 361/756 |
| 6,205,033 B1 | 3/2001 | Kelemen |
| 6,335,868 B1 | 1/2002 | Butterbaugh et al. |
| 6,373,712 B1 | 4/2002 | Bailis et al. |
| 6,385,053 B1 | 5/2002 | Parizi et al. |
| 6,466,449 B1 | 10/2002 | Sheen et al. |
| 6,522,554 B1 | 2/2003 | Gomez et al. |
| 6,580,616 B2 | 6/2003 | Greenside et al. |
| 6,646,868 B2 | 11/2003 | Ho et al. |
| 6,646,890 B1 | 11/2003 | Byers et al. |
| 6,661,673 B2 * | 12/2003 | Brooks et al. ............. 361/756 |
| 6,728,114 B2 | 4/2004 | Serjack et al. |
| 6,771,513 B2 | 8/2004 | LaMothe et al. |
| 6,999,319 B2 | 2/2006 | Wu et al. |
| 2004/0031767 A1 | 2/2004 | Ice |
| 2004/0032714 A1 | 2/2004 | Ice |
| 2004/0032715 A1 | 2/2004 | Ice |
| 2004/0037054 A1 | 2/2004 | Ice |
| 2004/0212973 A1 | 10/2004 | Ice |
| 2005/0135077 A1 | 6/2005 | Ice |

OTHER PUBLICATIONS

U.S. Appl. No. 10/638,982, filed Aug. 12, 2003, Ice.
U.S. Appl. No. 10/639,211, filed Aug. 12, 2003, Ice
U.S. Appl. No. 10/772,924, filed Feb. 5, 2004, Ice.
Cocumentation entitled "Self-Clinching Cable Tie-Mount", copyright 2001 by PEM Fastening Systems, a PennEngineering company (4 pages).

* cited by examiner

CARD CAGE SYSTEM

CROSS-REFERENCE TO RELATED APPLICATIONS

This application claims the benefit of U.S. Provisional Patent Application Nos. 60/403,342, entitled CARD CAGE SYSTEM and filed on Aug. 13, 2002, and 60/422,703, entitled CARD CAGE SYSTEM and filed on Oct. 31, 2002, both of which are incorporated herein in their respective entireties by this reference.

Further, this application hereby incorporates, in their respective entireties, the following United States Patent Applications filed the same day herewith: U.S. patent application Ser. No. 10/639,064, entitled ADAPTER ELEMENT FOR CARD CAGE SYSTEM (presently designated as Workman Nydegger docket number 15436.74.1.1); U.S. patent application Ser. No. 10/638,982, entitled FUNCTIONAL MODULE WITH CARD GUIDE ENGAGEMENT FEATURE (presently designated as Workman Nydegger docket number 15436.75.1.1); and, U.S. patent application Ser. No. 10/639,211, entitled ELECTROMAGNETIC RADIATION CONTAINMENT SYSTEM (presently designated as Workman Nydegger docket number 15436.76.1.1).

BACKGROUND

Technological Field

This invention is generally concerned with electronic equipment enclosures adapted to mechanically and electrically interface with plug-in type functional modules. More particularly, embodiments of the invention relate to a card cage system that can be readily customized by a user to accommodate a variety of functional module sizes, types, configurations, and arrangements.

Related Technology

Electronic equipment enclosures are used in a number of different industries and applications and generally serve to receive one or more pieces of electronic equipment and devices in such a way that the individual electronic components can operably interact with each other and/or with the electronic equipment enclosure. In some instances, such electronic equipment enclosures are configured to permit the use of one or more "plug-in" functional modules that electrically and mechanically interface with the electronic equipment enclosure and/or with other functional modules.

More specifically, many electronic equipment enclosures include internal structures configured to removably receive one or more functional modules in a desired arrangement. Such internal structures are often referred to as "card cages." The card cage is configured so that a user can define the functionality of the electronic equipment enclosure by selecting particular functional modules to be employed in the electronic equipment enclosure. In the event that it is desired to modify the functionality of a particular electronic equipment enclosure, such changes can be made simply by positioning additional functional modules in the card cage of the electronic equipment enclosure and/or by removing selected functional modules from the card cage of the electronic equipment enclosure.

The functionality implemented by any particular functional module or group of functional modules can vary widely. Notwithstanding their functional differences however, such functional modules may share a number of similar structural features.

For example, typical functional modules employed in conjunction with card cages include a printed circuit board, or "card," attached to a front panel that may include various indicators, readouts, and/or connectors. Circuitry disposed on the card communicates with such indicators, readouts and connectors and serves to implement the functionality associated with that particular functional module. Various connectors on the rear of the card permit communication between the functional module and other functional modules or components associated with the electronic equipment enclosure. Additionally, the front panel of the functional module typically includes a number of fasteners that engage corresponding structure of the card cage and thereby aid in removable retention of the functional module within the electronic equipment enclosure.

Conventional card cages for receiving such functional modules typically consist of mounting rails, card guides, and a backplane, and can be oriented horizontally or vertically. A typical horizontal card cage consists of one or more uniformly spaced card slots. Each card slot can accommodate a single uniformly sized functional module. The card slots are oriented horizontally and stacked vertically. Vertically oriented mounting rails are located on the left and right sides at the front of the card cage. A backplane is positioned at the rear of the card cage. The backplane typically consists of a printed circuit board containing connectors for each card slot.

Card guides are positioned on the left and right sides of the card cage and run from the front of the card cage back to the backplane. The card guides contain channels which guide the edges of the functional module PCB during insertion and align the connectors on the functional module with the corresponding backplane connectors. The functional modules are slid between corresponding pairs of card guides and the retention fasteners on the ends of the module front panel engage the mounting rails. A functional module can be taller than a single card slot by incorporating a larger front panel and additional printed circuit boards. The module height generally must be a multiple of the single slot height. However, the width of the module is generally constrained by the distance between the mounting rails of the card cage.

Such card cage arrangements serve to limit, at least, the size of the module, and corresponding card, that can be disposed within a single card cage slot. Thus, the functionality associated with a relatively wider functional module, such as might be required to permit the use of additional circuits and components, can only be implemented by positioning a series of relatively narrow cards above one another. As discussed below however, such arrangements can be problematic.

For example, each separate card must have its own electrical connection with the connectors on the card cage backplane. Moreover, the separate cards may each require additional structure, circuitry, or connections such as cables, for electrical communication with adjacent, or other, cards in the card cage system. Such requirements contribute to relatively high production costs for functional modules having these types of cards, and also serve to complicate installation. Further, in the event a functional module fails to operate properly, the use of a relatively larger number of electrical interfaces and connections impairs troubleshooting, diagnosis, and repair of the functional module.

The foregoing problems are likewise a matter of concern where two functional modules are arranged in an edge-to-edge type of arrangement. Moreover, such edge-to-edge arrangements implicate other problems as well. For example, conventional card cages configured to accommodate two single-wide cards in an edge-to-edge arrangement necessarily include a central structural element that defines a guide rail on either side. The guide rails provide support to an edge of each of the single-wide cards when those cards are received in the card cage. However, the presence of the center guide rails effectively prevents use of a double-wide, or larger, card in the same slot.

In particular, the center guide rails typically extend to the front of the equipment enclosure chassis and thus act to prevent insertion of the double-wide, or larger, card by blocking the path of the card edge. Thus, such configurations materially impair, among other things, the flexibility and the usefulness of conventional electronic equipment enclosures by limiting the ability of the user to change the arrangement of cards used in the electronic equipment enclosure, and by acting as a constraint on the size of the functional modules that may be employed.

Yet another area of concern with respect to typical arrangements of functional modules and card cages relates to the structures and devices typically employed to attach the functional module to the electronic equipment enclosure. In particular, many functional modules include a front panel with a flange that receives one or more screws positioned to engage the card cage rail and thereby secure the functional module to the card-cage rail. Typically however, this flange is configured and arranged so as to extend laterally beyond the periphery of the card. Thus configured, such modules cannot be positioned edge-to-edge, even if the guide rails of the card cages would otherwise permit such an arrangement, because the flanges and associated screws of the adjacent functional modules would mechanically interfere with each other.

Accordingly, what is needed is a card cage system having features directed to addressing the foregoing exemplary concerns, as well as other concerns not specifically enumerated herein. An exemplary card cage system should permit a user to readily customize the card cage to accommodate a variety of card sizes, types, configurations, and arrangements.

BRIEF SUMMARY OF AN EXEMPLARY EMBODIMENT OF THE INVENTION

In general, embodiments of the invention are concerned with a card cage system that can be readily customized by a user to accommodate a variety of card sizes, types, configurations, and arrangements.

In one exemplary embodiment of the invention, a card cage is provided that includes a middle card guide interposed in a spaced apart arrangement between first and second end card guides disposed within an electronic equipment enclosure. Each card guide defines channels configured to removably receive a portion of an edge of a card. Further, at least the middle card guide defines a slot that extends rearward from the front end of the middle card guide and that is aligned with the channels defined by the middle card guide.

The card cage further includes a plurality of adapter elements, each of which is configured to be removably received by a corresponding card guide. In the case of the middle card guide, at least, the adapter element blocks the entrance to the slot when the adapter element is positioned in the middle card guide. A channel defined by the adapter element is aligned with the channels defined by the middle card guide when the adapter element is thus positioned.

The foregoing exemplary configuration thus provides for definition of at least two different card storage modes. In the first card storage mode, adapter elements are positioned in each of the three card guides. The adapter element positioned in the middle card guide blocks the entrance to the slot defined by the middle card guide, thereby permitting two single-wide cards to be disposed in the card cage in a side-by-side arrangement. In particular, one edge of the first card is received in the channels defined on one side of the middle card guide and the adapter element, while the opposing edge of the first card is received in the channel defined by an end card guide, so that the single-wide card is supported at its edges by the middle card guide and the end card guide. In general, the arrangement of the second, adjacent, card in the card cage mirrors the arrangement of the first card.

Definition of the second card storage mode occurs when the middle card guide adapter element is removed, thereby clearing the entrance to the slot defined by the middle card guide, so as to allow insertion of a double-wide, or larger, card in the card cage. In particular, the leading edge of the double-wide card is received in the now open slot defined by the middle card guide so that the double-wide card straddles the middle card guide. The opposing side edges of the double-wide card are slidingly received in, respectively, the channels defined by the first and second end card guides.

Thus, a user can quickly and easily customize the card cage configuration to accommodate different card sizes, types, configurations and arrangements. Moreover, the adapter elements permit the card cage to be readily reconfigured without disassembling the chassis. These and other aspects of embodiments of the present invention will become more fully apparent from the following description and appended claims.

BRIEF DESCRIPTION OF THE DRAWINGS

In order that the manner in which the above-recited and other aspects of the invention are obtained, a more particular description of the invention briefly described above will be rendered by reference to specific embodiments thereof which are illustrated in the appended drawings. Understanding that these drawings depict only exemplary embodiments of the invention and are not therefore to be considered limiting of its scope, the invention will be described and explained with additional specificity and detail through the use of the accompanying drawings in which.

DETAILED DESCRIPTION OF EXEMPLARY EMBODIMENTS OF THE INVENTION

Figure 1:
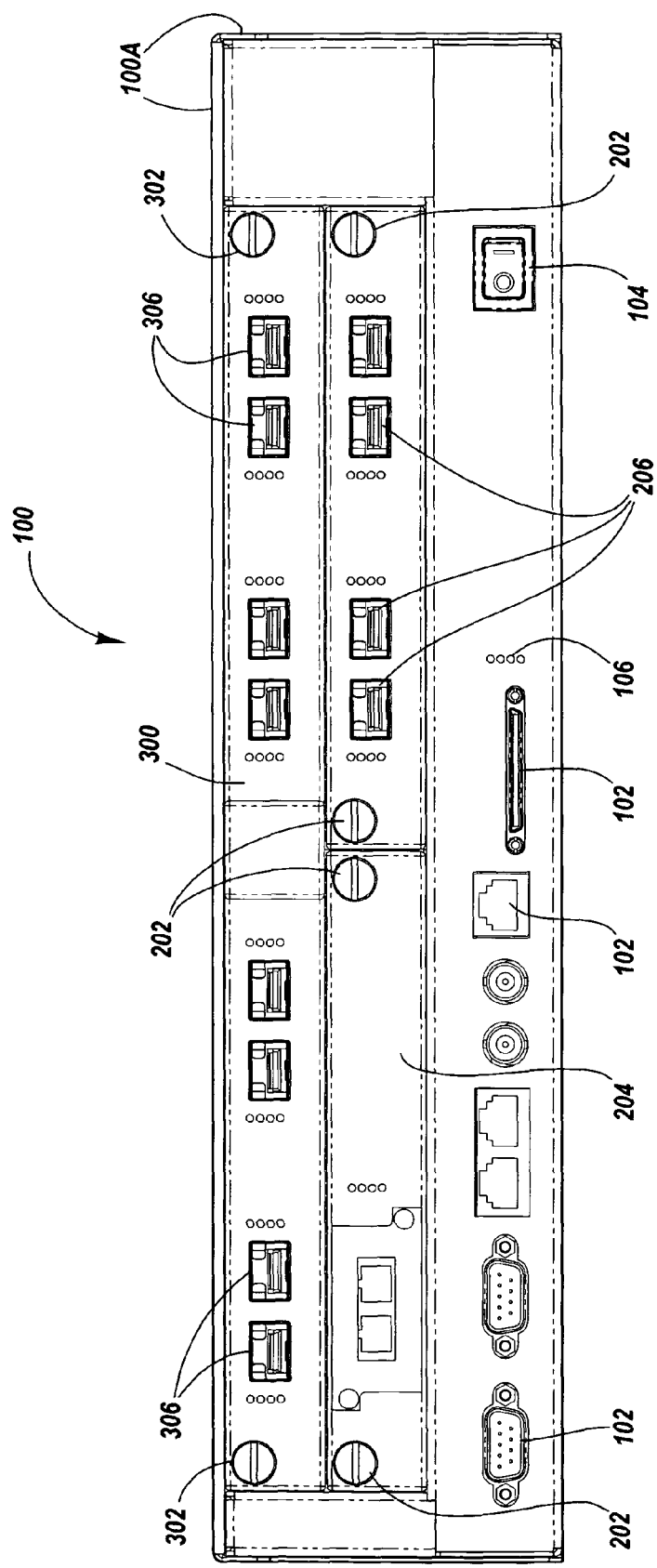
FIG. 1 is a front view illustrating various aspects of an embodiment of an electronic equipment enclosure that includes an exemplary arrangement of single-wide and double-wide functional modules.

Reference will now be made to figures wherein like structures will be provided with like reference designations. It is to be understood that the drawings are diagrammatic and schematic representations of various embodiments of the claimed invention, and are not to be construed as limiting the scope of the present invention in any way, nor are the drawings necessarily drawn to scale.

Generally, embodiments of the invention concern a card cage system that can be quickly and easily customized to accommodate different functional module sizes, types, configurations and arrangements. In exemplary embodiments of the invention, functional modules of various sizes are accommodated within a card cage that includes a plurality of card guides and corresponding adapter elements. The card guides cooperate with the adapter elements to facilitate accommodation of different combinations of single-wide and double-wide, or larger, functional modules.

In addition, exemplary embodiments of the card cage can be configured to accommodate various types and sizes of different functional modules in a variety of different arrangements. One or more uniformly sized card slots can be arranged in a rectangular array consisting of some number of rows and columns. A single card slot can accommodate a single size functional module or multiple card slots may be combined from adjacent rows and columns to accommodate functional modules that are a multiple of the single size module in width, height or both. Reconfiguration of the card cage to accommodate a larger module does not impair the functionality or flexibility of adjacent card slots in any way. Additionally, the entire card cage can be configured so that the individual card slots are either horizontal or vertical.

It should be noted that although the particular description herein makes reference to a card cage system that can be configured to accommodate both single and double-wide functional modules in various arrangements, embodiments of the card cage system can be readily adapted to accommodate triple-wide, or larger, functional modules, in a variety of different arrangements. Further, the card cage system disclosed herein may also be readily configured to accommodate modules of different heights, such as double height, or larger, modules that include two or more printed circuit boards ("PCB") in a stacked arrangement. The aforementioned aspects may also be combined in some embodiments, so that a card cage is implemented that is configured to accommodate a stacked arrangement of double height, or larger, modules that may or may not also be double-wide, or wider.

The foregoing thus makes clear that embodiments of the invention are not limited to any particular card cage configuration. Rather, various embodiments of the card cage are able to accommodate, in a variety of arrangements, one or more functional modules of various heights and widths. Accordingly, the scope of the invention should not be construed to be limited to any particular card cage configuration.

Figure 4:
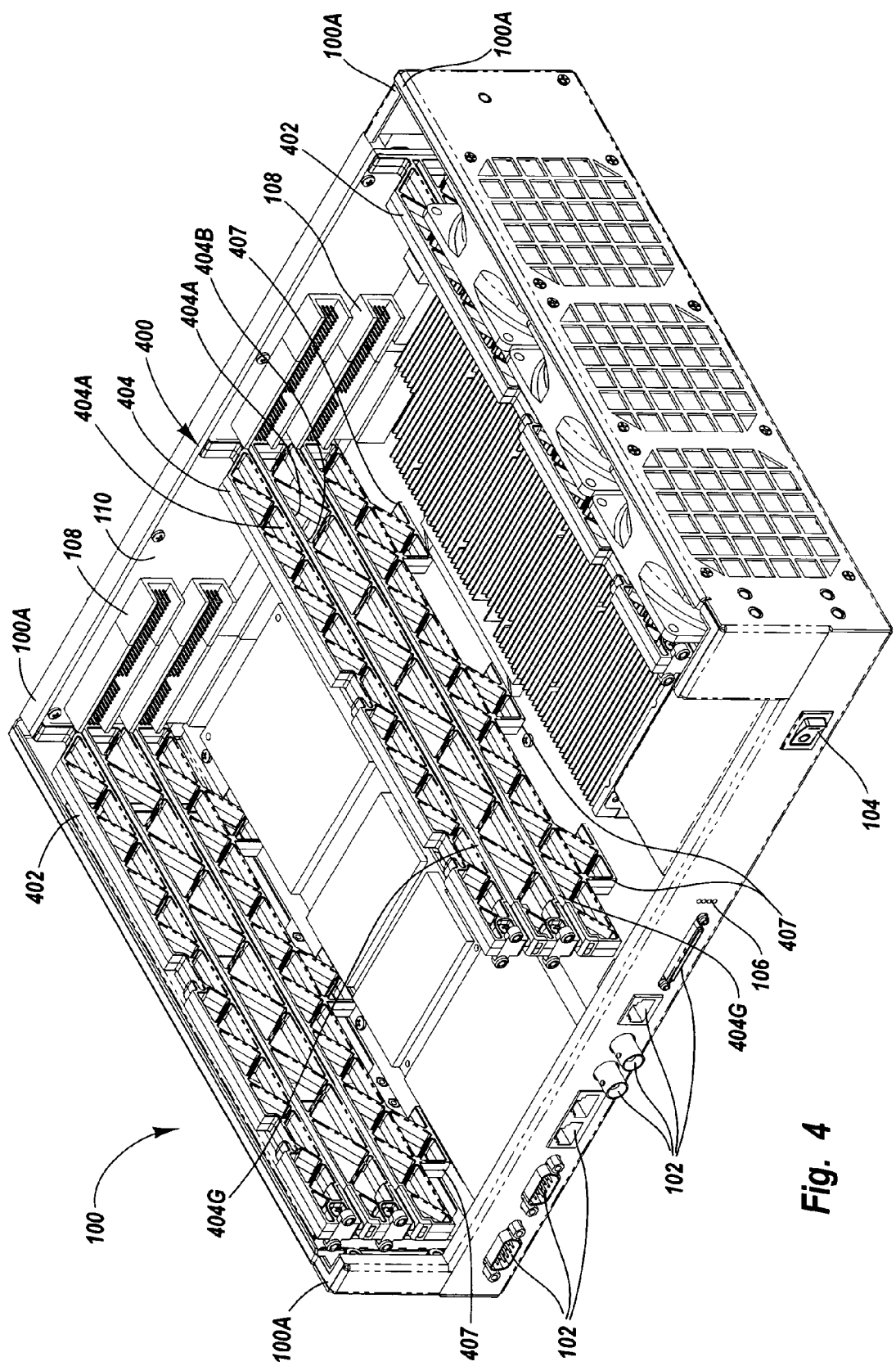
FIG. 4 is a perspective view illustrating various features of an exemplary embodiment of an electronic equipment enclosure (cover removed for clarity) that includes a card cage system having multiple card guides.

Reference is first made to FIG. 1 wherein an exemplary embodiment of an electronic equipment enclosure is denoted generally at 100, and includes a chassis 100A, various front connectors 102, a power switch 104, indicators 106, and rear connectors 108 disposed on backplane 110 (see FIG. 4). Alternative embodiments of electronic equipment enclosure 100 may be configured in any manner necessary to suit functional, dimensional and/or other applicable requirements. By way of example, electronic equipment enclosure 100 may have a nominal height of 2 U, 3 U or 6 U, depending upon the requirements of a particular application, wherein each increment of 1 U corresponds to a distance of one-and-three-quarters (1.75) inches. Such dimensions are exemplary only however, and are not intended to limit the scope of the invention in any way.

The illustrated embodiment of the electronic equipment enclosure 100 additionally includes an exemplary arrangement of two single-wide functional modules 200 and one double-wide functional module 300. It should be noted that, as used herein, 'single-wide' and 'double-wide' refer to functional modules that include an associated card having a nominal width that is some multiple of a predetermined dimension. The use of such notation herein should not, however, be construed in any way to limit the scope of the invention to cards and/or functional modules of particular dimensions or configurations.

Figure 2B:
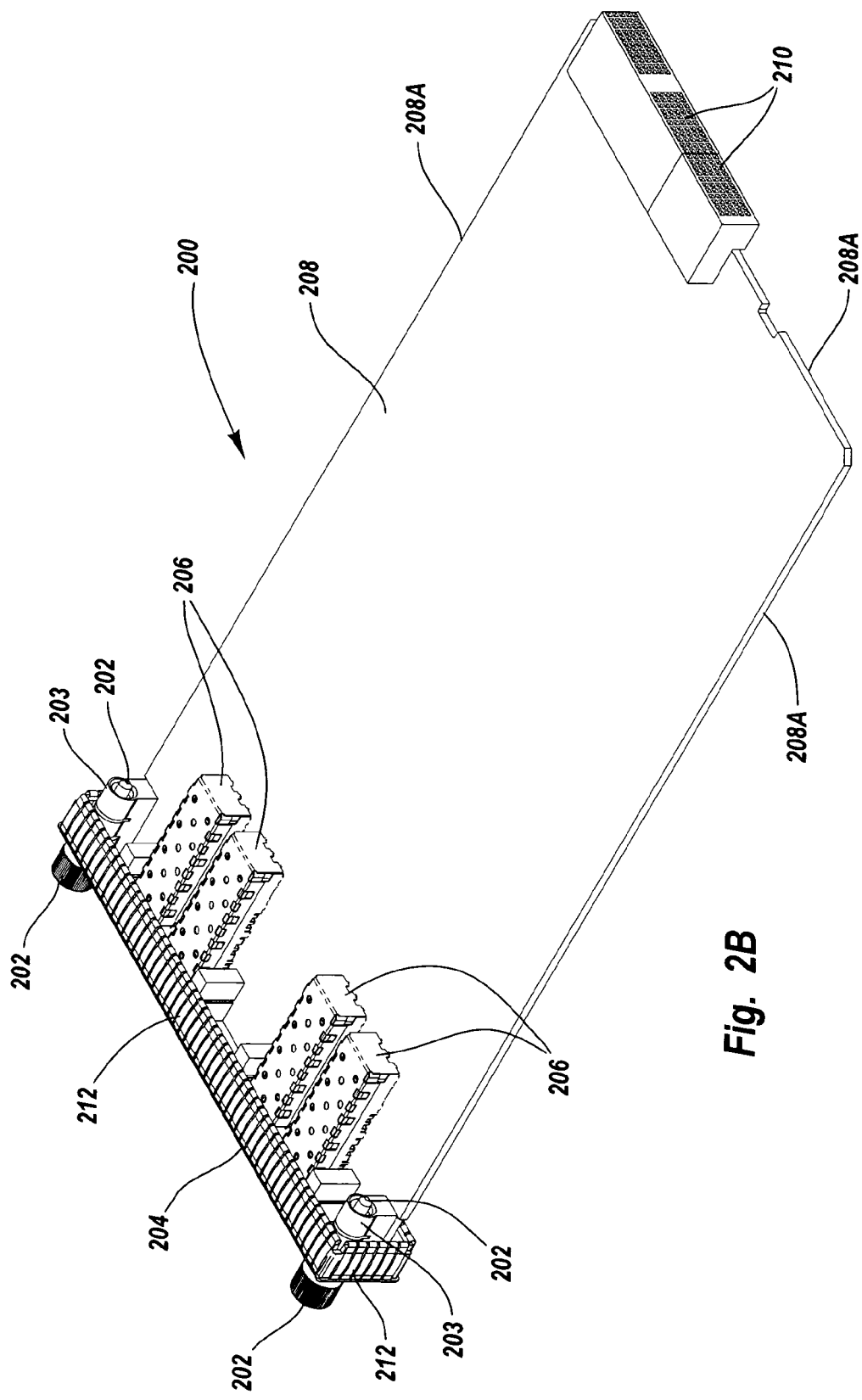
FIG. 2B is a rear perspective view of the single-wide functional module illustrated in FIG. 2A.
Figure 3A:
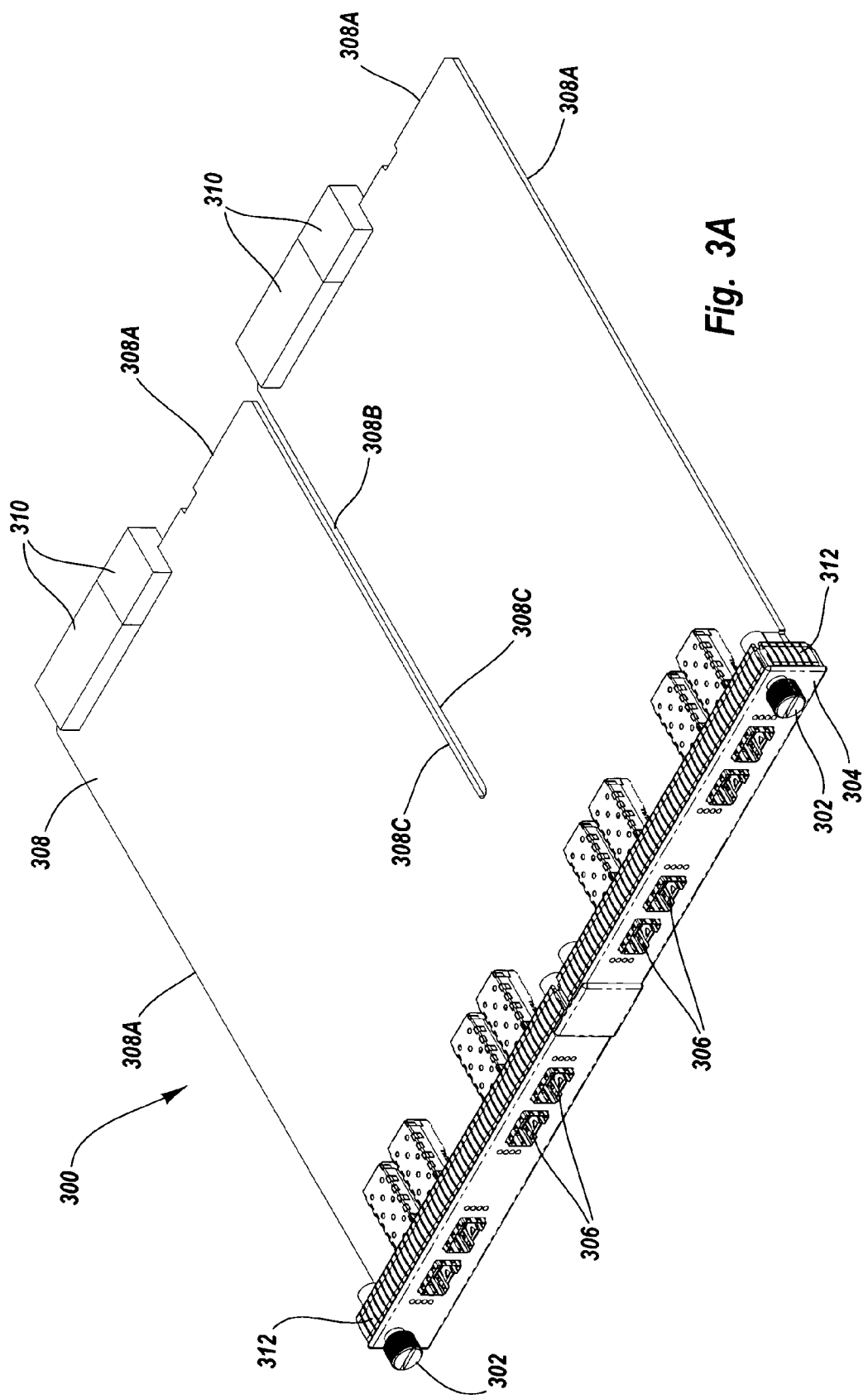
FIG. 3A is a front perspective view of a double-wide functional module such as may be employed with embodiments of the card cage system.
Figure 3B:
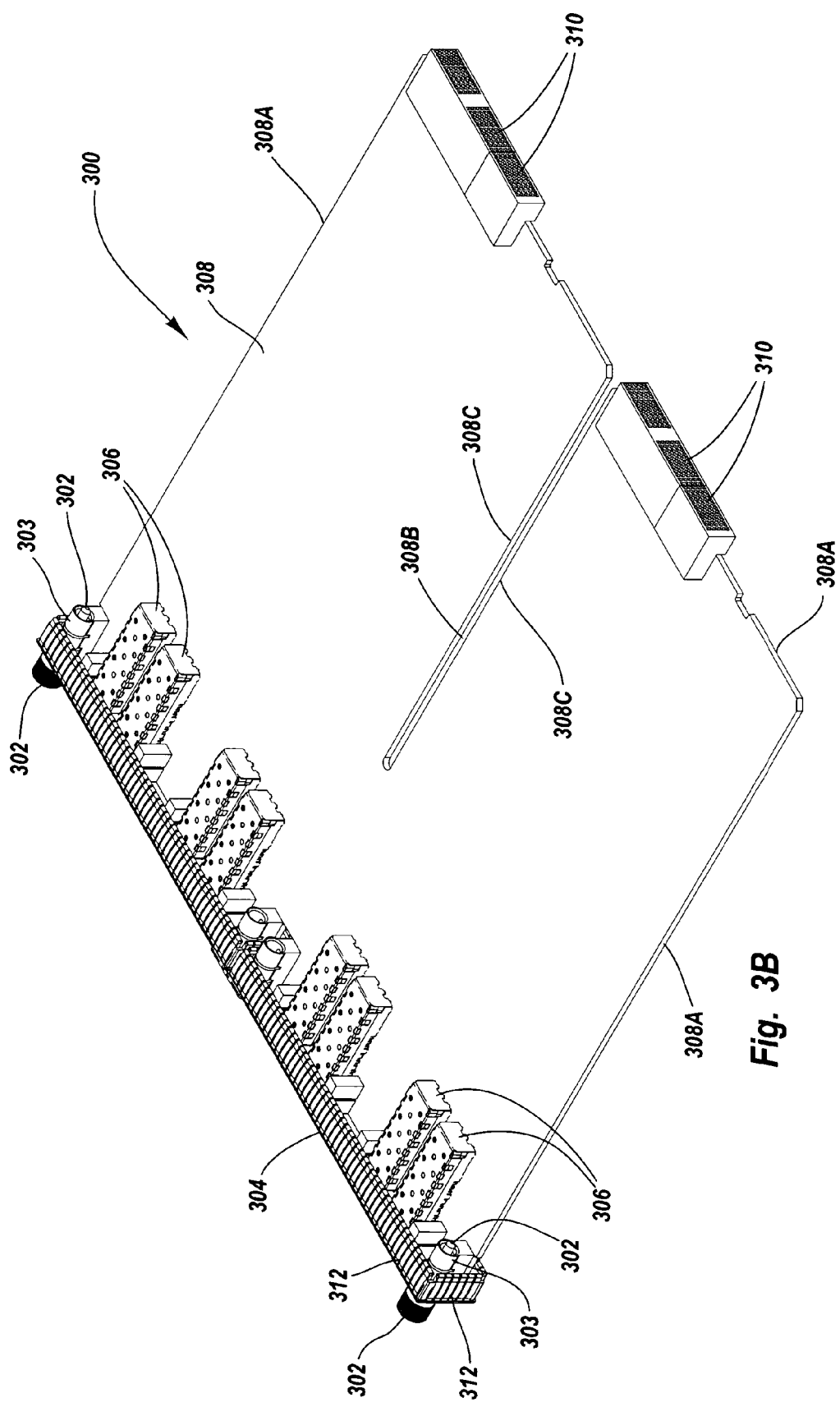
FIG. 3B is a rear perspective view of a double-wide functional module illustrated in FIG. 3A.

As discussed in greater detail elsewhere herein, the functional modules 200 and 300 are removably secured to a card cage system 400 (see FIG. 4) through the use of fasteners 202 and 302, respectively, that pass through corresponding lead-in structures 203 (FIG. 2B) and 303 (FIG. 3B). Generally, the lead-in structures 203 and 303 are configured and arranged to engage corresponding structure (see boss 514 in FIGS. 5B and 5D) of an adapter element 500. The lead-in structures facilitate ready and reliable positioning of the fasteners relative to the adapter element when it is desired to install a functional module in the card cage.

Figure 2A:
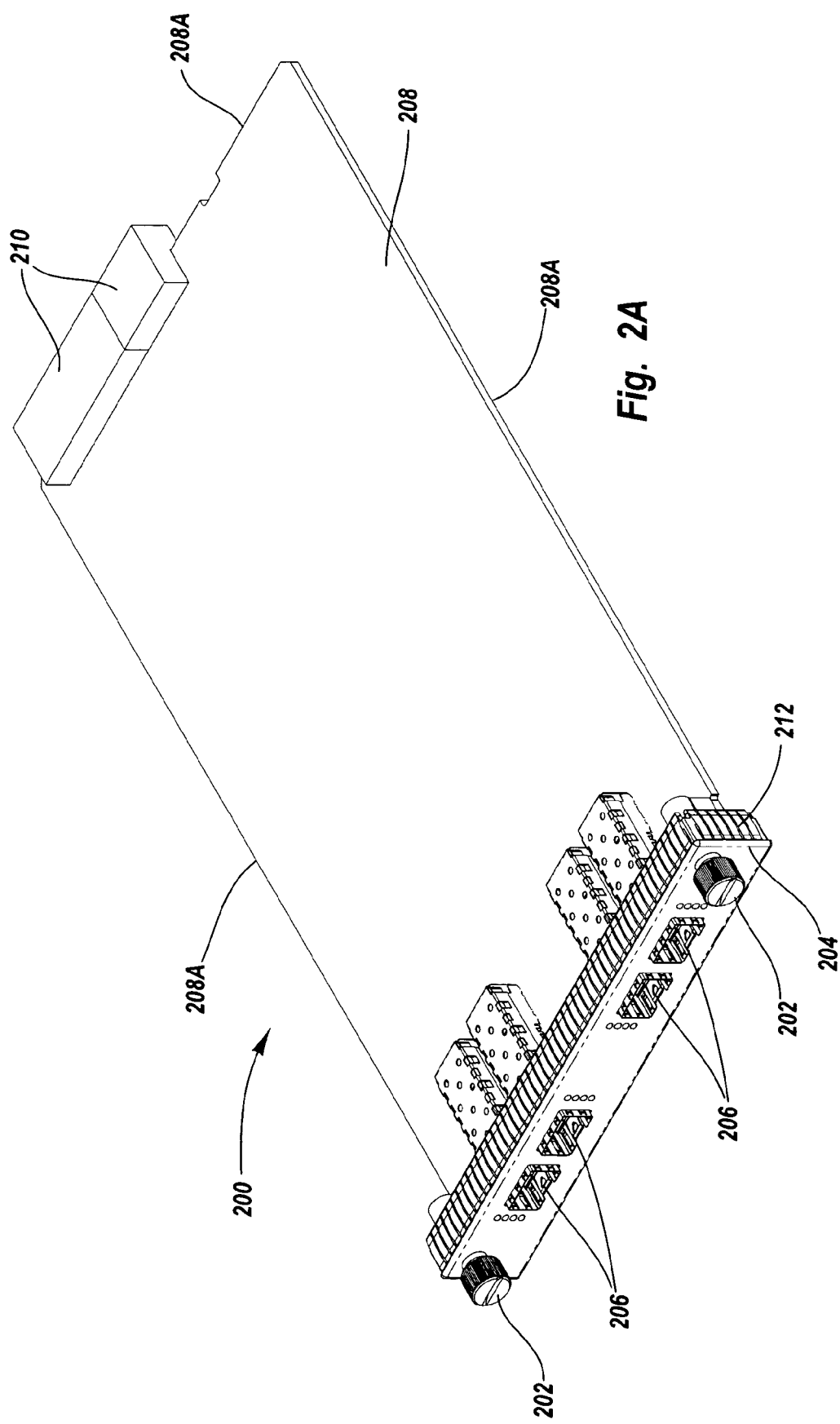
FIG. 2A is a front perspective view of a single-wide functional module such as may be employed with embodiments of the card cage system.

In the exemplary embodiment illustrated in FIG. 1, fasteners 202 and 302 comprise thumb screws that extend through corresponding front panels 204 and 304 of functional modules 200 and 300 respectively (see, e.g., FIGS. 2A and 3A). The fasteners 202 and 302 each include a nose portion having a taper that is complementary with the card cage system structure, as discussed below. More generally however, any other fastener or device having the functionality disclosed herein may alternatively be employed.

Further, functional modules 200 and 300, such as may be employed in conjunction with the with card cage system 400, each include various electronic circuitry and devices (not shown) which are effective to implement their particular respective functionality, or functionalities. Exemplary functionality for functional modules 200 and/or 300 includes, but is not limited to, various types of multi-channel applications.

Such electronic circuitry and devices communicate electrically with various components, functional modules and devices within, and/or external to, electronic equipment enclosure 100. In at least some embodiments, such electrical communication is achieved, at least in part, through the use of connectors 210 and 310, respectively, that are electrically connected with the circuitry and devices of functional modules 200 and 300, respectively, and are configured and positioned to mechanically and electrically interface with corresponding rear connectors 108 disposed on the backplane 110 of electronic equipment enclosure 100.

As suggested above, the illustrated arrangement of functional modules is exemplary only and is not intended to limit the scope of the invention. By way of example, an alternative embodiment of electronic equipment enclosure includes four arrangement, but does not include any double-wide functional modules 300. In such a double height arrangement, cards may, at the option of the user, be stacked on first and second card storage levels defined by the card cage system (see FIG. 4). In other embodiments, triple height, or higher, arrangements may be employed. Yet another alternative embodiment of the electronic equipment enclosure includes two double-wide functional modules 300 stacked one on top of the other, but does not include any single-wide functional modules 200. Yet another exemplary embodiment is configured to receive triple-wide, or larger, functional modules, either alone or in combination with functional modules of other sizes or configurations.

More generally then, aspects pertaining to the arrangement of exemplary functional modules 200 and 300 in the electronic equipment enclosure 100 may be varied as necessary to suit the requirements of a particular application, and the scope of the invention should not be construed to be limited by the exemplary arrangements disclosed herein.

Directing attention now to FIGS. 2A and 2B, further aspects of an exemplary embodiment of single-wide functional module 200, such as may be employed in connection with embodiments of card cage system 400 (FIG. 4), are considered. Generally, single-wide functional module 200 includes a single-wide card 208, which comprises a printed circuit board ("PCB") in at least some embodiments, attached to the front panel 204. The single-wide card 208 includes a plurality of edges 208A that define the length and width of single-wide card 208.

Disposed on single-wide card 208 are various electronic circuitry and devices (not shown) which are effective to implement the particular functionality, or functionalities, associated with single-wide functional module 200. In general, such circuitry (not shown) and devices (not shown) are arranged for electrical communication with various components, functional modules and devices within, and/or external to, electronic equipment enclosure 100 by way of the connectors 206, and/or connectors 210 disposed proximate an edge 208A of card 208.

With continuing attention to FIGS. 2A and 2B, single-wide functional module 200 includes a plurality of conductive elements 212 disposed about the perimeter of front panel 204. Generally, conductive elements 212 are useful in the control of electromagnetic emissions from the interior of electronic equipment enclosure 100, and thereby aid in the control and/or reduction of electromagnetic interference ("EMI") caused by components and circuitry associated with electronic equipment enclosure 100.

Directing attention now to FIGS. 3A and 3B, various details are provided concerning an exemplary embodiment of double-wide functional module 300 such as may be employed in connection with embodiments of card cage system 400 (FIG. 4) of electronic equipment enclosure 100. The double-wide functional module 300 includes a double-wide card 308, which comprises a PCB in at least some embodiments, attached to the front panel 304. In general, double-wide card 308 includes a plurality of edges 308A that define the length and width of double-wide card 308. Moreover, double-wide card 308 defines a slot 308B having a predetermined length, and including opposing edges 308C spaced at a predetermined distance apart from each other so as to cooperatively define a slot width.

Disposed on double-wide card 308 are various electronic circuitry and devices (not shown) which are effective to implement the particular functionality, or functionalities, associated with double-wide functional module 300. In general, such circuitry (not shown) and devices (not shown) are arranged for electrical communication with various components, functional modules and devices within, and/or external to, electronic equipment enclosure 100 by way of the connectors 306, and/or connectors 310 disposed proximate an edge 308A of card 308.

Similar to single-wide functional module 200, the exemplary embodiment of double-wide functional module 300 illustrated in FIGS. 3A and 3B includes a plurality of conductive elements 312 disposed about the perimeter of front panel 304 that are useful in the control of electromagnetic emissions from the interior of electronic equipment enclosure 100, and thereby aid in the control and/or reduction of EMI caused by components and circuitry associated with electronic equipment enclosure 100.

With the foregoing general aspects of various exemplary functional modules in view, attention is directed now to FIG. 4, where various details are provided concerning an exemplary embodiment of card cage system 400 suited for use in implementing various desired arrangements of such functional modules within electronic equipment enclosure 100.

In the illustrated embodiment, card cage system 400 includes three double height card guides that cooperate to define first and second card storage levels. The card guides, designated end card guides 402 and middle card guide 404, are disposed in a spaced-apart configuration with respect to each other. As suggested by the foregoing, variables such as, but not limited to, the number, height, width, length, spacing, and the number of card storage levels of end card guides 402 and middle card guide(s) 404 may be varied as necessary to suit the requirements of a particular application.

Although end card guides 402 and middle card guide 404 are distinctively named herein, such card guides are substantially similar as regards many aspects of their construction and operation. Such standardized construction, for example, facilitates ready manufacturing of the card guides, and also contributes to ease of installation. In some embodiments, the card guides comprise various types of injection molded plastic(s), however, any other suitable material(s) may alternatively be employed.

With general reference to their construction and arrangement, end card guides 402 and middle card guide 404 include connecting members 406 (see FIG. 5A), or other suitable structure(s), that facilitate attachment of the card guide to the floor, lid, backplane 108, chassis 100A and/or other structural elements of the electronic equipment enclosure 100. The illustrated connecting members 406 are exemplary only however, and any other structural configuration effective in providing comparable functionality may alternatively be employed. In at least some embodiments, connecting members 406 are configured and arranged to permit end card guides 402 and middle card guide 404 to be readily removed and reinstalled in electronic equipment enclosure 100, or in another electronic equipment enclosure or system.

Some embodiments of end card guides 402 and/or middle card guide 404 additionally include one or more positioning members 407. Generally, positioning members 407 are constructed and arranged to aid in disposing the card guide at a desired location and orientation within electronic equipment enclosure 100. In some embodiments, both connecting members 406 and positioning members 407 comprise integral portions of the card guide.

Figure 5A:
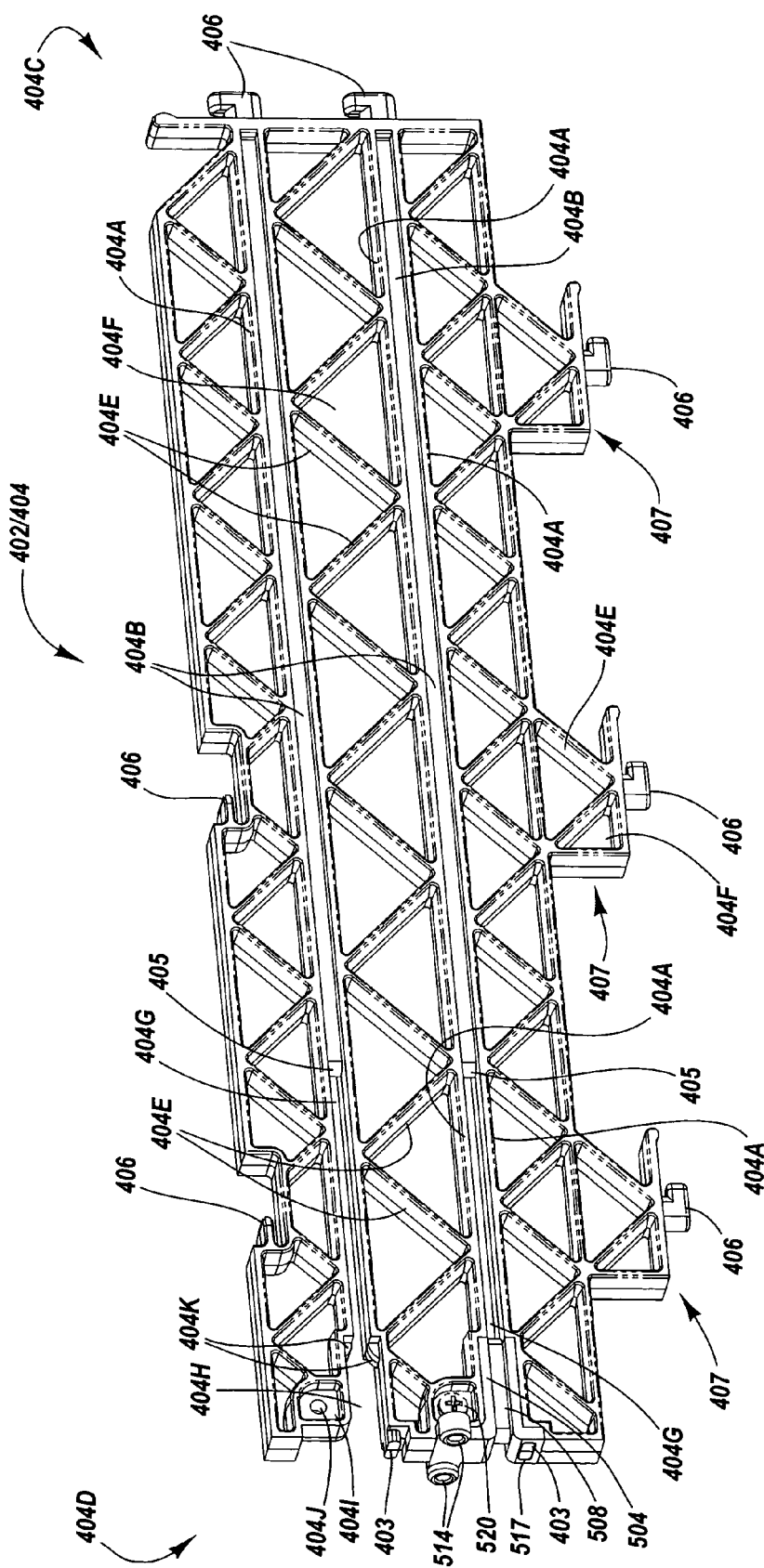
FIG. 5A is a perspective view of an exemplary embodiment of a card guide and associated adapter element.

Directing attention now to FIG. 5A, and with continuing reference to FIG. 4, further details are provided concerning various aspects of end card guides 402 and middle card guide 404, as well as their relationship with one or more adapter elements 500. As noted earlier, end card guides 402 and middle card guide 404 are substantially similar with respect to many aspects of their construction and operation. Accordingly, while the following discussion is directed to an exemplary embodiment of middle card guide 404, it should be understood that, except as may be noted, such discussion is generally germane with respect to end card guides 402 as well.

In the exemplary embodiment illustrated in FIGS. 4 and 5A, middle card guide 404 comprises a double height card guide, that is, it is capable of accommodating two vertically stacked cards. In the illustrated embodiment, middle card guide 404 includes, on each side, upper and lower sets of sidewalls 404A that cooperate to define, respectively, upper and lower channels 404B (sidewalls 402A cooperate to define channels 402B in the case of end card guides 402, see FIGS. 6 and 8) whose open side is oriented substantially laterally with respect to middle card guide 404. In the illustrated embodiment, channels 404B defined in the middle card guide 404 start at back end 404C of middle card guide 404 and terminate some distance short of front end 404D of middle card guide 404. In the exemplary embodiment illustrated in FIG. 5A, the front end terminal point of channels 404B is denoted at 405.

With respect to the channels defined by end card guides 402, at least two alternative arrangements may be employed. In one exemplary embodiment, the construction of the end card guides 402 contrasts with that of the middle card guides 404 in that channels 402B of end card guides 402 run substantially the entire length of end card guide 402. Alternatively however, end card guides 402 may be constructed similar to middle card guides such that channels 402B of end card guides 402 terminate short of front end 402D of end card guide 402.

With continuing attention now to the exemplary illustrated embodiment of middle card guide 404, the height of sidewalls 404A and width of channel 404B are generally such as to permit a card edge 208A of card 208, or card edge 308A of card 308 in the case of end card guide 402 (see FIGS. 6 through 8), to be slidingly received in the channel 404B and substantially restrained from significant vertical motion by sidewalls 404A. Further, the spacing between middle card guide 404 and end card guides 402 is calculated to limit lateral motion of an inserted single-wide card when opposing card edges 208A of a single-wide card 208 are received in channels 404B and 402B defined, respectively, by middle card guide 404 and end card guide 402. The same effect is likewise achieved when the opposing edges 308A of double-wide card 308, or the opposing edges of a larger card, are received in the end card guides 402.

As suggested elsewhere herein, variables such as the number of channels in a particular card guide or set of card guides, may be varied so as to permit accommodation of more, or fewer, cards in the card cage system 400. Moreover, other aspects such as, but not limited to, the length, width, depth, disposition, and orientation of channels and/or aspects of other features of the card guides, may be varied as necessary to suit the requirements of a particular application or the use of a particular card.

With continuing reference now to the illustrated embodiment, FIGS. 4 and 5A indicate that the two channels 404B on either side of middle card guide 404 are separated by a support structure 404E that, among other things, provides structural integrity to card cage system 400 and aids in the restraint of vertical and lateral motion of the received card.

Exemplarily, the support structure 404E comprises a web structure that is punctuated by openings 404F that are sized and located to permit implementation of the support structure 404E while, at the same time, permitting the unrestricted flow of cooling air across the card cage and through the middle card guide 404 as compared with a solid structural member, without compromising the structural integrity of middle card guide 404. Moreover, support structure 404E is configured and arranged to ensure adequate vertical clearance between two cards stacked in card cage system 400.

The support structure illustrated is exemplary only however, and any other structure, or combination thereof, suitable for implementing comparable functionality may alternatively be employed. Further, it may be desirable in some instances to implement the support structure as a relatively solid structure instead of as a web structure. Accordingly, the scope of the invention should not be construed to be limited to arrangements such as those illustrated.

As further illustrated in FIGS. 4 and 5A, the support structures 404E of middle card guide 404, at least, further define a slot 404G passing laterally through middle card guide 404 and located at the front end 404D adjacent to, and aligned with, channel 404B. Similar to channels 404B, the sides of slot 404G are defined by sidewalls 404A and the width of slot 404G is, in the exemplary illustrated embodiment, substantially the same as the width of channel 404B. Moreover, support structure 404E is interposed between the two slots 404G. Similar to the case of channels 404B, aspects of the configuration of slot 404G, such as its width, may be varied as desired. Generally however, the width of slot 404G is such that slot 404G is able to slidingly receive at least a portion of a card edge, such as 208A or 308A for example.

With more particular attention now to FIG. 5A, at least middle card guide 404 further includes, in addition to other structural aspects disclosed herein, a receptacle 404H located proximate front end 404D and aligned with slot 404G. In general, receptacle 404H is configured and arranged so that adapter element 500 can be removably positioned therein. To that end, middle card guide 404 further includes a fastener recess 404I that defines a hole 404J configured to receive a corresponding fastener and thereby aid in the removable retention of an adapter element 500 in the card guide, as discussed below.

In addition to the foregoing aspects, some exemplary implementations of the adapter element 500 further include a pair of ramps 404K configured and arranged to cooperate with a mating tongue 522 of the adapter element 500 to implement various useful functionalities, as discussed in further detail below. The ramps 404K, or any comparable structures, are useful as well when no adapter element 500 is present. By way of example, the geometry and positioning of the ramps 404K prevent the edge of a card inserted into the receptacle 404H from getting jammed in the receptacle 404H. In particular, the ramps 404K serve to guide the edge of the inserted card into the slot 404G defined by the card guide 404, regardless of the orientation of the card edge when it was initially inserted into the receptacle 404H.

Figure 5B:
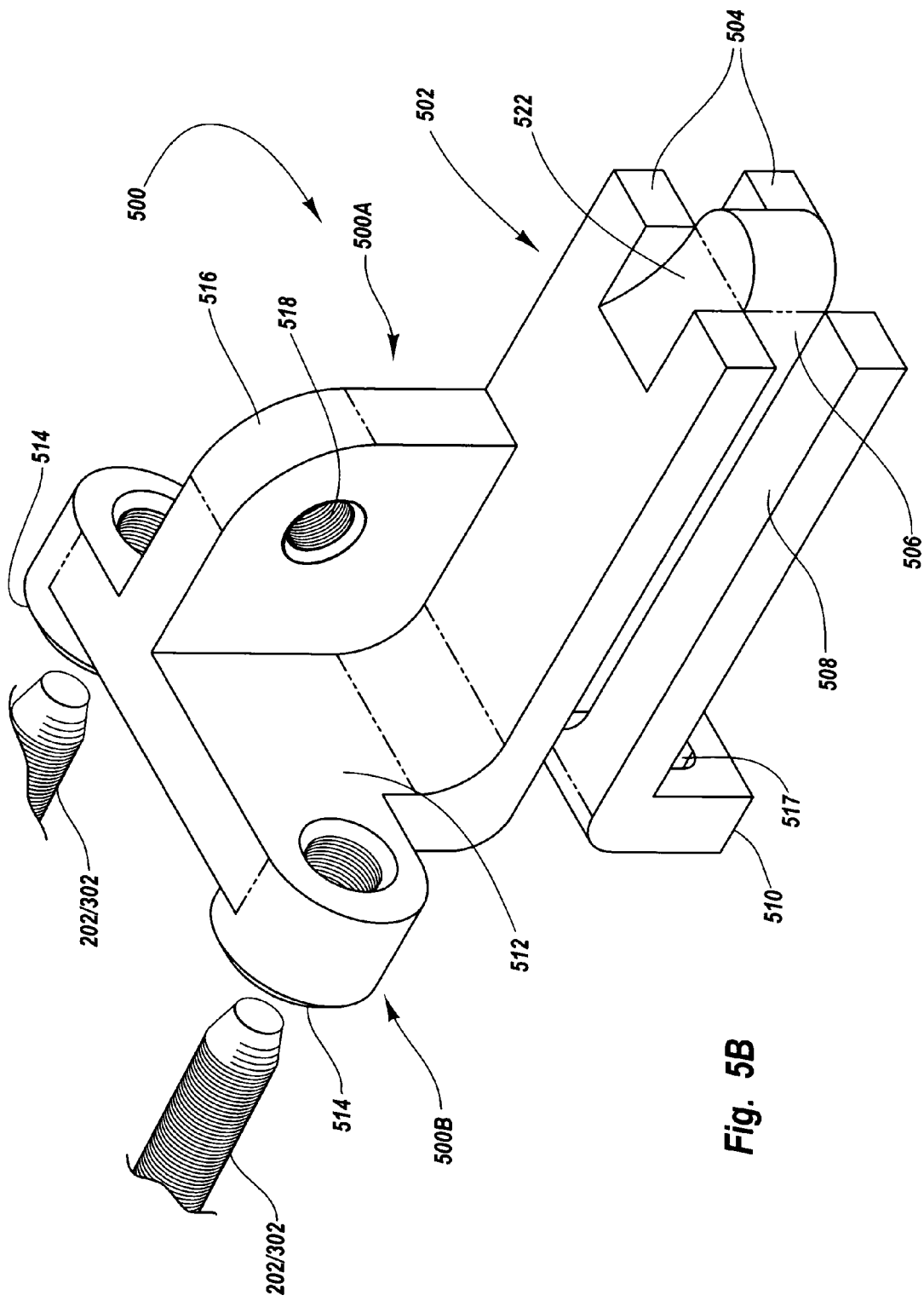
FIG. 5B is a perspective view of an exemplary embodiment of an adapter element.
Figure 5C:
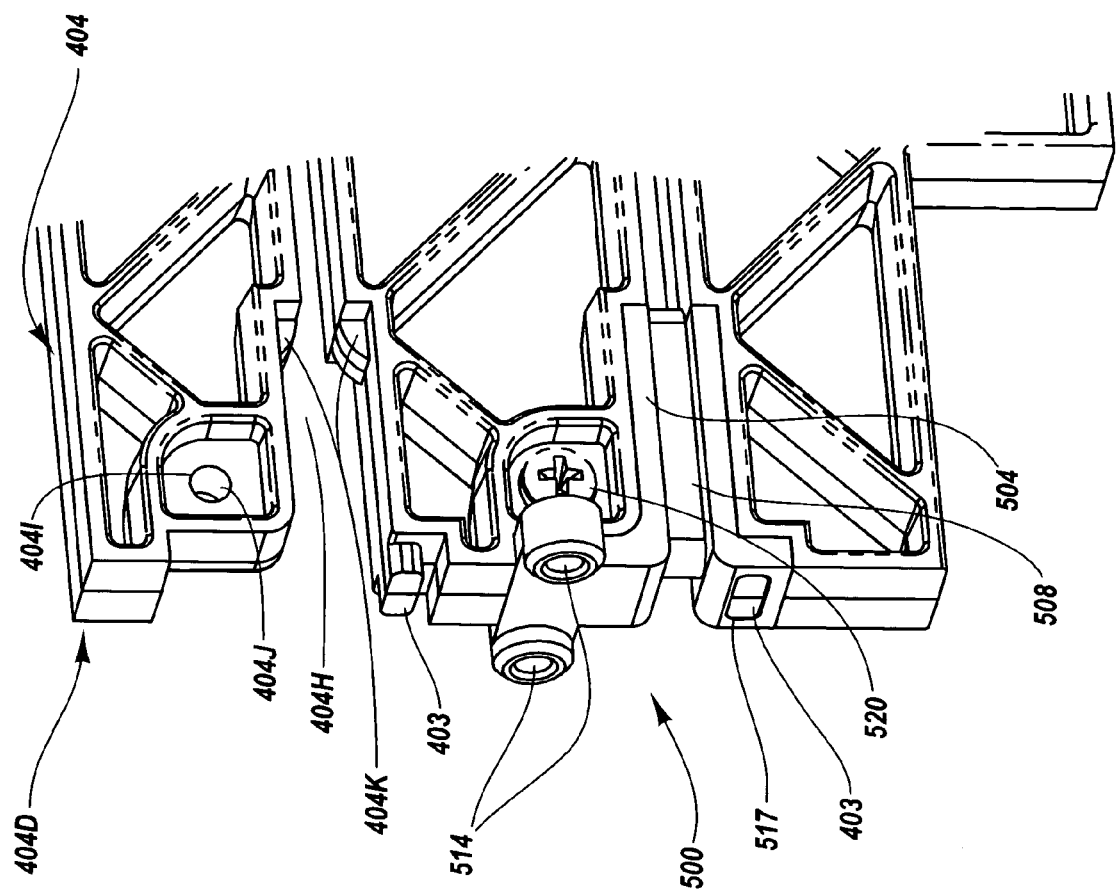
FIG. 5C is a detail perspective view of the exemplary adapter element illustrated in FIG. 5B.

Directing particular attention now to FIG. 5B, and with continuing attention to FIG. 5A, details are provided concerning aspects of an exemplary embodiment of the adapter element 500 such as is suitable for use in the above-described card cage environment.

In general, the illustrated embodiment of adapter element 500 comprises die cast metal, or other suitable material(s), and is configured to be removably positioned within the receptacle 404H defined by a card guide, such as end card guide 402 or middle card guide 404, so as to facilitate ready customization of the card cage system 400 as necessary to suit desired card arrangements within electronic equipment enclosure 100. It should be noted that both the processes and materials used in the construction of the adapter element 500 may vary depending upon factors such as, but not limited to, the requirements of a particular application or operating environment. Accordingly, the scope of the invention is not limited to the exemplary embodiments disclosed herein.

More particularly, the illustrated embodiment of the adapter element 500 comprises a card guide interface portion 500A and a functional module interface portion 500B that, exemplarily, are integral with each other. In other implementations, the card guide interface portion 500A and functional module interface portion 500B comprise discrete elements that have been joined together to form the adapter element 500. Additionally, and as suggested in the exemplary implementation of the adapter element 500 illustrated in FIG. 5B, the card guide interface portion 500A may be configured to facilitate, to varying extents, both engagement of the adapter element 500 with a card guide and engagement of the adapter element 500 with a functional module. The same is likewise true with respect to the functional module interface portion 500B.

Moreover, the particular configurations of the card guide interface portion 500A and the functional module interface portion 500B, and the manner in which the card guide interface portion 500A and the functional module interface portion 500B are arranged with respect to each other and to the card guides and functional module, may be varied as required. Accordingly, the scope of the invention should not be construed to be limited to any particular configuration of adapter element 500, nor to any particular arrangement, configuration or functionality of either the card guide interface portion 500A or the functional module interface portion 500B.

With renewed attention now to FIG. 5A, an exemplary card guide interface portion 500A includes a body 502 that defines an I-beam configuration having two flanges 504 that cooperate with an interconnecting web 506 to define channels 508 on either side of adapter element 500 that are substantially aligned with, for example, slot 404G and channels 404B of middle card guide 404, when adapter element 500 is positioned in receptacle 404H. When positioned in this way, adapter element 500 thus cooperates with middle card guide 404, for example, to define, on either side of the middle card guide 404, a channel that runs substantially the length of the middle card guide (see, e.g., FIG. 5A). It should be noted here that the removable positioning of the adapter element 500 in one or more end card guides 402 is achieved in substantially the same fashion as that described above with respect to middle card guide 404.

In some embodiments, the retention and stability of adapter element 500 is further aided by the presence of a foot 510 that is joined to the front end of the lower flange 504 of the body and that engages corresponding structure on the middle card guide 404. Structural elements such as foot 510 are exemplary only however, and any other suitable structure(s) effective in implementing the functionality herein may alternatively be employed.

The functional module interface portion 500B of the illustrated embodiment of adapter element 500 exemplarily includes a first attachment member 512, which exemplarily comprises a substantially vertical wall, attached to the front end of the upper flange 504. In this exemplary configuration, the first attachment member 512 includes a portion that extends outwardly some distance from the front face of the card guide when the adapter element 500 has been positioned in the card guide (see FIG. 5) and that defines two bosses 514 positioned to engage fasteners 202 or 302 of functional modules 200 or 300, respectively.

With respect to the configuration of the bosses 514 thus defined, the illustrated embodiment provides for bosses 514 that are tapped in the first instance, thereby obviating the need for the addition of tapped inserts. Tapped inserts are useful however, where the adapter element 500 is constructed of materials less robust than die cast metal, such as plastics for example. Moreover, some embodiments of the adapter element 500 further provide for bosses 514 and/or tapped inserts, as applicable, that further define a tapered counterbore configured and arranged to aid in the initial positioning of fasteners 202 or 302 (see FIG. 5D).

In addition, the card guide interface portion 500A of the illustrated embodiment of the adapter element 500 further includes a second attachment member 516, which exemplarily comprises a chock positioned between the first attachment member 512 and the upper flange 504, and offset to one side of the upper flange 504. The second attachment member 516 of adapter element 500 defines a tapped retention screw hole 518 adapted to engage the threads of a fastener 520 (see FIG. 5C) passing through hole 404J of middle card guide 404. One consequence of this arrangement is that adapter element 500 can be removably joined to middle card guide 404, as indicated, for example, in FIGS. 5C and 5D. It should be noted that the removable positioning of the adapter element 500 in one or more end card guides 402 is achieved in substantially the same fashion as that described above with respect to middle card guide 404.

Finally, the card guide interface portion 500A of the illustrated embodiment of the adapter element 500 includes a tongue 522. As indicated in FIGS. 5A and 5B, the tongue 522 is configured and arranged to cooperate with the upper and lower flanges 504 of the adapter element 500 in accommodating the corresponding ramps 404K defined by the card guide so that relative motion between the adapter element 500 and the card guide is substantially prevented. It should be noted that the geometry of the tongue 522 and/or the ramps 404K may be varied as necessary to suit the requirements of a particular application. For example, some implementations of the tongue 522 and ramps 404K are configured with straight, rather than curved, mating surfaces.

As suggested by the foregoing, various structural elements and arrangements may be employed to removably attach the adapter element 500 to a card guide. As another example, some embodiments of the adapter element 500 are configured to snap into, and out of, complementary structure defined by the card guide, without necessitating the use of fasteners.

The interface between the adapter element 500 and the end card guide 402 and/or middle card guide 404 may include additional features as well. For example, in some embodiments, adapter element 500 and/or end card guide 402 and middle card guide 404 further comprise structural elements that, in general, serve to substantially prevent, or at least limit, the motion of the adapter element 500 relative to the card guide when the adapter element 500 is fully received in the card guide. Among other things, such arrangements serve to increase the structural rigidity of the card cage 400 and contribute to the ease with which cards may be inserted into, and removed from, the card cage 400.

Aspects of one example of such an arrangement are indicated in FIGS. 5A and 5B. In particular, the exemplary illustrated embodiment of the adapter element 500 defines a slot 517 configured to engage the post 403 defined by a card guide wherein the adapter element 500 is received. The relatively close fit between the post 403 and slot 517 serves to substantially prevent relative motion between the adapter element 500 and the mating card guide.

Of course, a variety of other structural elements and arrangements may be employed to implement such functionality. Accordingly, the post/slot arrangement described above comprises one exemplary structural implementation of a means for substantially preventing relative motion between an adapter element and a card guide when the adapter element is attached to the card guide. In another exemplary implementation, the adapter element includes one or more posts or similar structures protruding from the rear of the flanges and configured and arranged to be received in corresponding recesses defined by a card guide. In yet other implementations, the upper and lower flanges of the adapter element include tabs or other structures that cooperate with the flanges to form upper and lower U-shaped structures configured and arranged to receive portions of the card guide. The 'arms' of the U-shaped configuration thus substantially prevent relative motion between the adapter element and the card guide. Finally, some exemplary implementations include combinations of the tabs and posts described above.

As suggested by the disclosure herein concerning various exemplary embodiments of the adapter element 500, a variety of structure(s) may alternatively be employed to perform the functionality implemented thereby. Thus, the embodiments of adapter element 500 disclosed herein simply comprise exemplary structural implementations of a means for facilitating definition of multiple card storage configurations.

By way of example, in one alternative embodiment, the adapter element remains attached to its associated card guide at all times and is configured to be moved between first and second positions that correspond to different card storage configurations. In some embodiments, the means for facilitating definition of multiple card storage configurations comprises a plurality of adapter elements. For example, in a card cage system that includes two or more card middle card guides interposed between a first and second end card guide, at least two adapter elements, that is, those received in the middle card guides, would be used to change the card storage configuration.

Accordingly, it should be understood that such structural configurations are presented herein solely by way of example and should not be construed as limiting the scope of the present invention in any way. Rather, any other structure or combination of structures effective in implementing the functionality disclosed herein may likewise be employed.

Figure 5D:
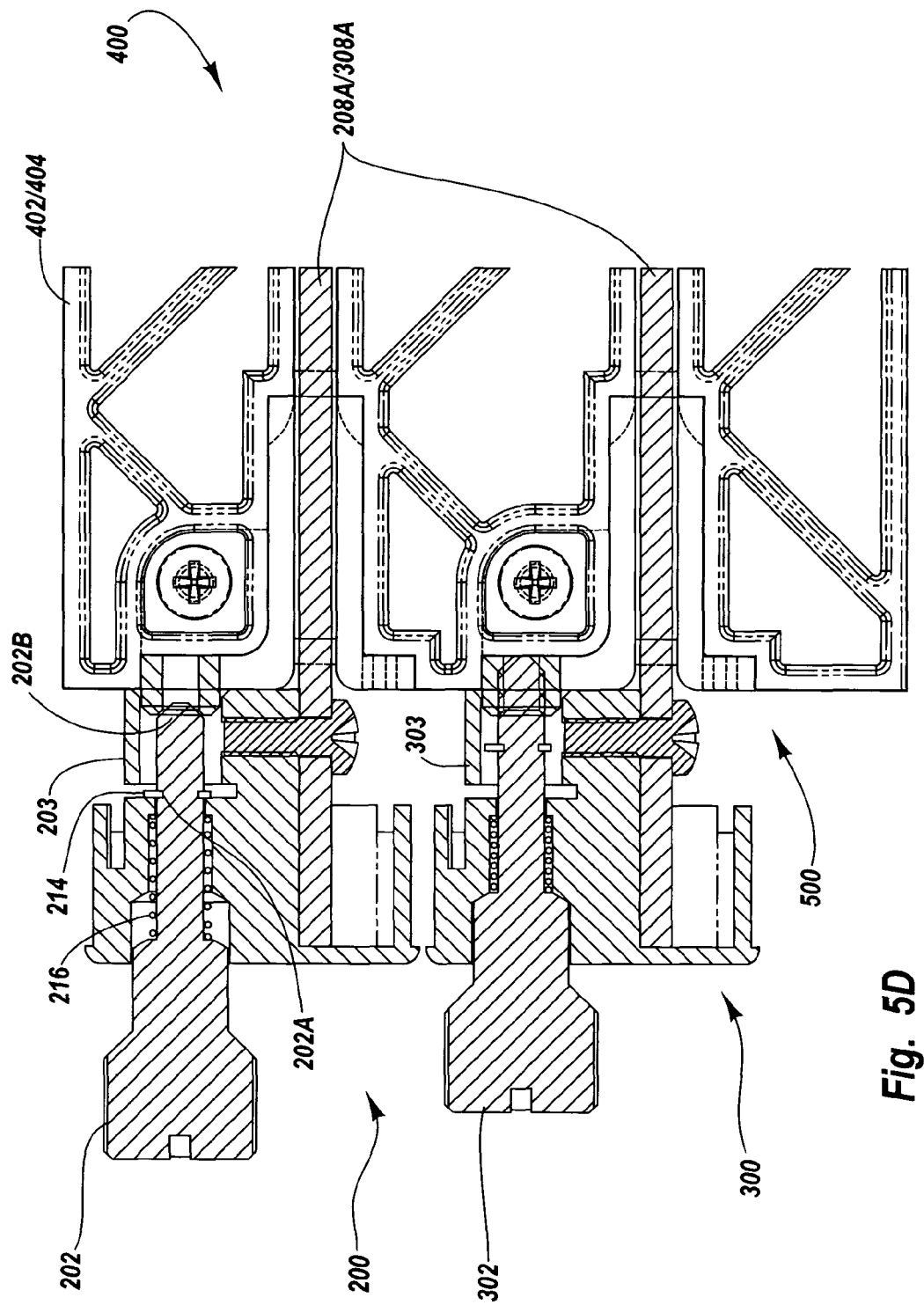
FIG. 5D illustrates various aspects of the relationship between the exemplary embodiments of the adapter element and the card guide depicted in, respectively, FIGS. 5B and 5C.

With reference now to FIG. 5D, further details are provided concerning the relation between an exemplary embodiment of the adapter element 500 and the card guides, as such relation concerns the positioning and retention of various configurations of functional modules in the card cage system.

In particular, when positioned and retained in receptacle 404H of the middle card guide 404, adapter element 500 cooperates with middle card guide 404 such that an edge 208A of a single-wide card 208, for example, is received simultaneously in channel 508, slot 404G, and channel 404B. Note that, in the case where the adapter element 500 is disposed in an end card guide 402, the edge 208A of a single-wide card 208, the edge 308A of a double-wide card 308, or the edge of a larger card, is thus received.

With continuing reference to the exemplary use of the adapter element 500 in the middle card guide 404, the opposing edge of the single-wide card is likewise received in the corresponding structure of the adjacent end card guide 402 and its associated adapter element. Because adapter element 500, similar to middle card guide 404, includes a channel 508 on either side, an additional single-wide card can be likewise be positioned on the opposing side of adapter element 500, such that two single-wide cards are disposed in a side-by-side arrangement at the same card storage level.

At the same time as adapter element 500 cooperates with middle card guide 404 to accommodate one or more single-wide cards, web 506 of adapter element 500 substantially blocks the entrance to slot 404G defined by middle card guide 404, thereby preventing insertion of a double-wide, or larger, card at that card storage level. However, other receptacles 404H of card cage system 400 may be left open, thereby allowing insertion of a double-wide, or larger, card in another location within the card cage system, as discussed elsewhere herein.

Once positioned thus in card cage system 400, a card, such as single-wide card 208 of single-wide functional module 200 or double-wide card 308 of double-wide functional module 300 for example, is securely retained in position by the engagement of fasteners 202 or 302, as applicable, with the threaded bosses 514 defined by the first attachment member 512 of adapter element 500. As particularly indicated in FIG. 5D, fastener 202 defines a circumferential slot 202A configured to receive an e-clip 214. In general, e-clip 214 prevents fastener 202 from being fully withdrawn from single-wide module 200. Fastener 302 is similarly retained in double wide functional module 300.

As further specifically indicated in FIG. 5D, a spring 216 is provided that serves to urge fastener 202 away from boss 514 when the fastener 202 is disengaged therefrom. Finally, a tapered nose portion 202B of fastener 202 aids in the initial alignment of fastener 202 with boss 514 which, as noted earlier, exemplarily includes a complementary countersink wherein tapered nose portion 202B is initially received. The tapered nose portion 202B also precludes binding of fastener 202 when it is brought into engagement with boss 514. Note that while the preceding discussion has primarily been directed to fastener 202, such discussion is equally germane to fasteners of other functional modules as well.

At any time after installation of a functional module, removal and/or replacement of that functional module is readily effected by simply disengaging the fasteners of the functional modules from the corresponding holes of the associated adapter element(s) 500. In connection with the foregoing, it should be noted that the use, or not, of the adapter element 500 does not compromise the functionality of any of the card slots. That is, one or more functional modules can be arranged in any configuration or combination desired by a user without impairing in any way the functionality of such functional modules, or the device in which they are received.

Thus, one aspect of the adapter element 500 is that it permits the fasteners 202 of the single-wide functional module 200, for example, to be positioned in such a way that a single-wide functional module 200 can be installed and used, for example in a side-by-side arrangement with another functional module, without interfering in any way with the adjacent functional module. However, while the foregoing aspect of the invention is considered in light of a side-by-side arrangement of two single-wide functional modules, such aspect is equally germane to side-by-side, or vertically stacked, arrangements of functional modules of any size. Further, as the disclosure herein makes clear, the use of one or more adapter elements 500 permits the card cage to be readily reconfigured without disassembling the chassis within which the card cage is disposed.

As suggested by the foregoing, embodiments of the card cage system 400 can be readily customized to accommodate different combinations and arrangements of cards of various sizes, types and configurations. Directing attention now to FIGS. 6 through 8, details are provided concerning exemplary functional module arrangements that may be implemented within embodiments of card cage system 400. Of course, such arrangements are exemplary only and are not intended to limit the scope of the invention in any way.

Figure 6:
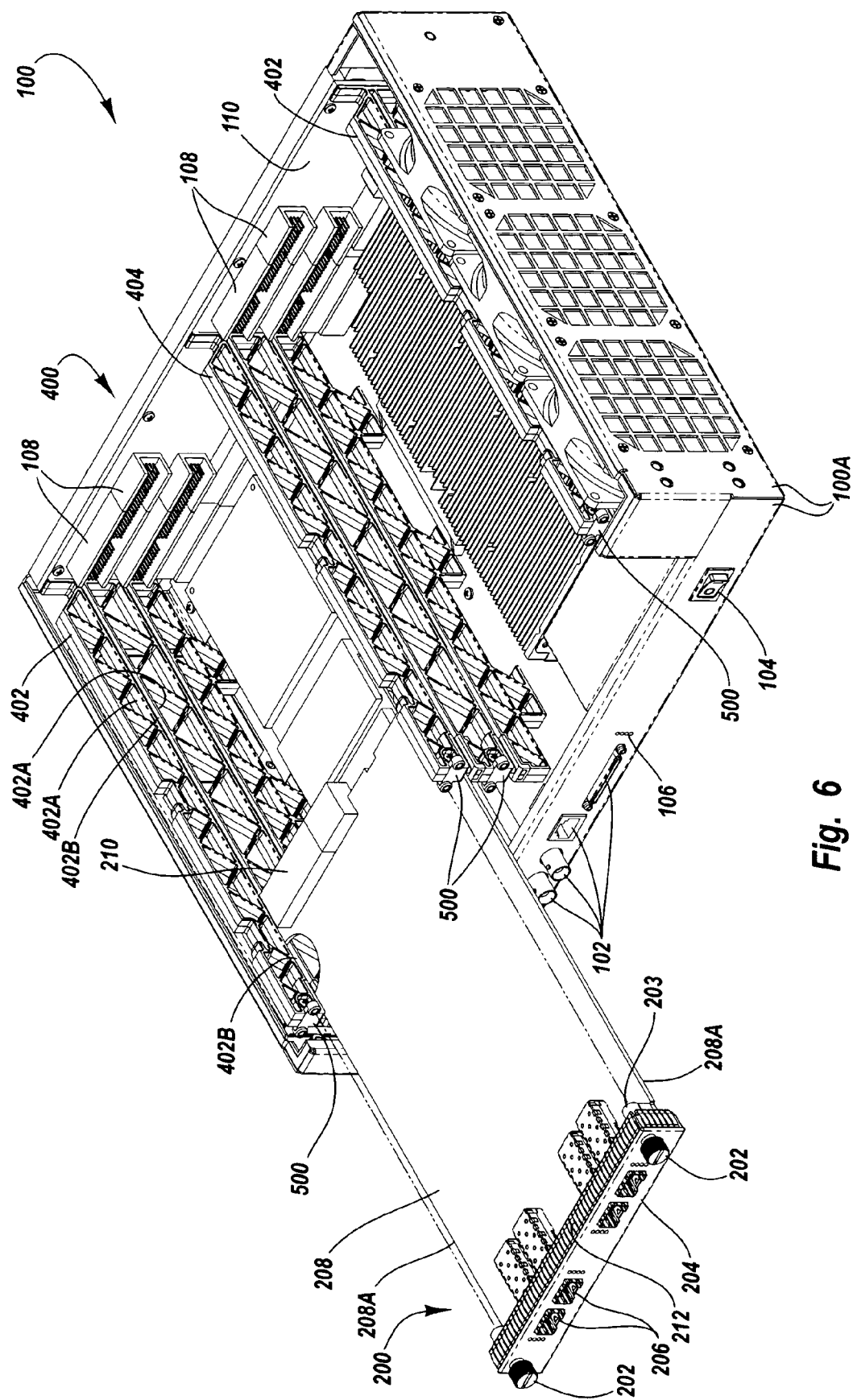
FIG. 6 is a perspective view that illustrates various features of the relation between an exemplary embodiment of the card cage system and a single-wide functional module, the card of the single-wide functional module having a portion cut away to reveal aspects of the relation between a card edge and the card guide.

With particular reference first to FIG. 6, aspects of a configuration wherein two single-wide functional modules 200 may be situated in a side-by-side arrangement are indicated. In this exemplary configuration, an adapter element 500 is present in recesses 402H and recess 404H, respectively, of each of the card guides 402 and 404 of the upper card storage level. As a result, two single-wide functional modules 200 can be placed in a side-by-side configuration in the upper card storage level.

In particular, the opposing edges 208A of card 208 are slidingly received in the channels 402B and 404B defined by end card guide 402 and middle card guide 404, respectively, as suggested in FIG. 6. The functional module 200 is then advanced into the card cage system until the rear surface of front panel 204 contacts the front surface of the adapter element 500 in the middle card guide 404 and the corresponding adapter element 500 in the end card guide 402. At this point, the connectors 210 are in mechanical and electrical communication with rear connectors 108 of the electronic equipment enclosure 100. The functional module 200 is then removably secured in position by engaging the fasteners 202 with the adapter element 500 and tightening the fasteners 202 securely. While only one single-wide functional module 200 is illustrated in FIG. 6, it can readily be seen that another single-wide functional module 200 may be positioned immediately adjacent to the illustrated single-wide functional module 200 in a similar fashion.

Figure 7:
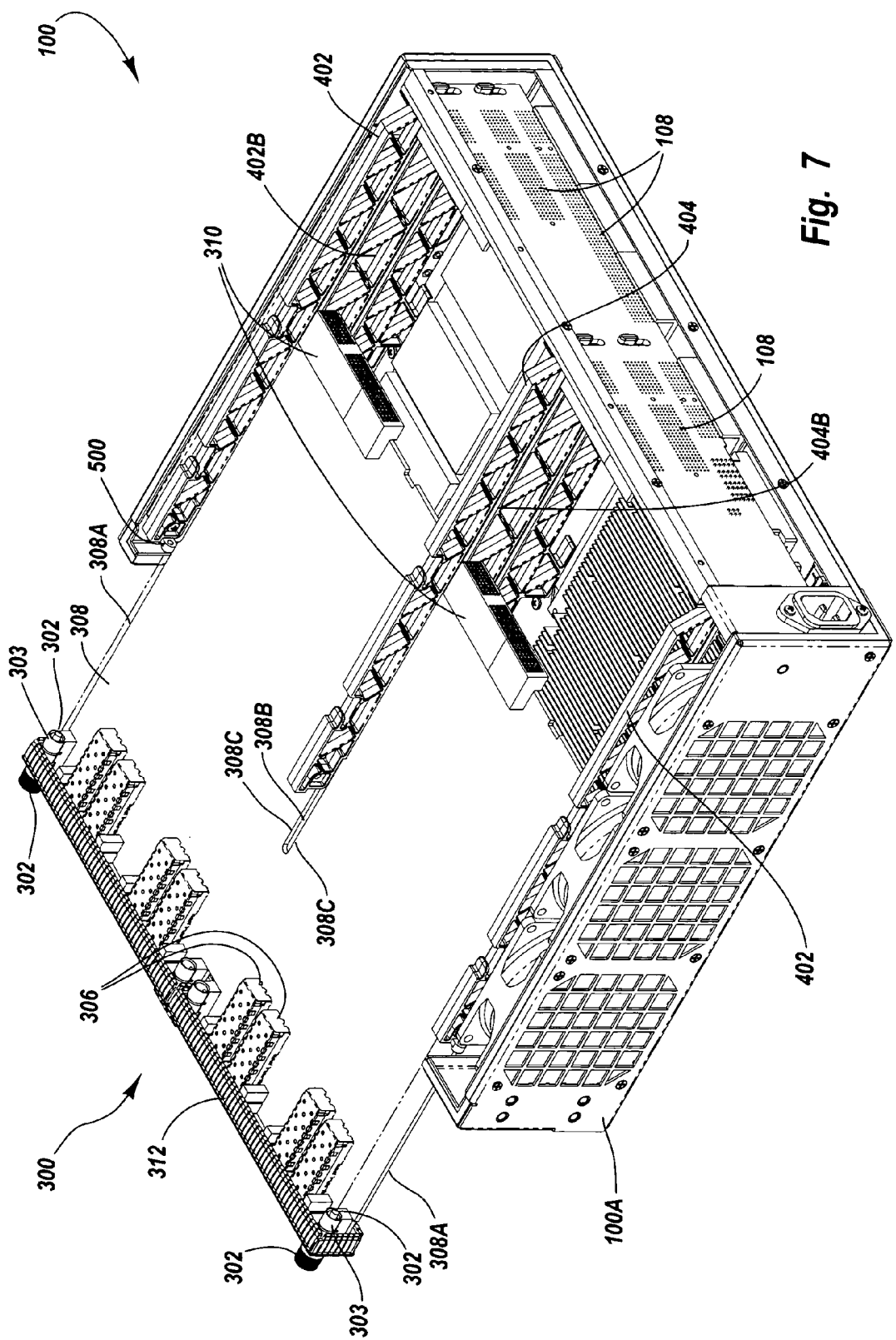
FIG. 7 is a perspective view that illustrates various features of the relation between an exemplary embodiment of the card cage system and a double-wide functional module.

Directing attention next to FIG. 7, aspects of a configuration wherein a single double-wide functional module 300 may be situated in the card cage system 400 are indicated. In this exemplary configuration, an adapter element 500 is present in each of the end card guides 402 but not in middle card guide 404. Thus, a double-wide functional module 300 can be readily positioned in the upper card storage level by selective employment of the adapter elements 500 in the card cage 400.

In particular, the opposing edges 308A of card 308 are slidingly received in the channels 402B defined by the end card guides 402, as suggested in FIG. 7. At the same time, the opposing edges 308C of a slot 308B of card 308 engage channels 404B disposed on either side of the middle card guide 404 (see, e.g., FIG. 5A) so that card 308 straddles, and is supported by, the middle card guide 404, as well as being supported at its edges 308A by the end card guides 402. This result is due to the fact that when an adapter element 500 is not present in the middle card guide 404, card 308 is able to enter slot 404G and travel along the middle card guide 404 until card 308 is positioned as described above.

At this point, the connectors 310 are in mechanical and electrical communication with rear connectors 108 of the electronic equipment enclosure 100. As with the single-wide functional module 200, the double-wide functional module 300 can then be removably secured in position by engaging the adapter elements 500 in end card guides 402 with the fasteners 302 and tightening the fasteners securely. Thus, one or more adapter elements 500, in cooperation with one or more middle card guide(s) 404 and end card guides 402, facilitate the use of double-wide, or larger, cards within card cage system 400.

The foregoing and other aspects of the card cage system 400 are useful at least because they facilitate implementation of a relatively higher level of functionality, by virtue of the double-wide or larger card configuration, even in those electronic equipment enclosures that are subject to relatively restrictive dimensions or form factors, such as a 2U height equipment enclosure for example. Moreover, such aspects of the card cage system 400 eliminate the need, in many cases, for the connecting cables or other devices, that might otherwise be required to establish communication between two related, but separate, single-wide cards.

In addition to facilitating use of relatively large cards such as double-wide and larger cards, embodiments of the card cage system 400 are well-suited for the implementation of various arrangements of one or more single-wide cards in conjunction with one or more double-wide, or larger, cards. Aspects of one such exemplary arrangement are illustrated in FIG. 8.

Figure 8:
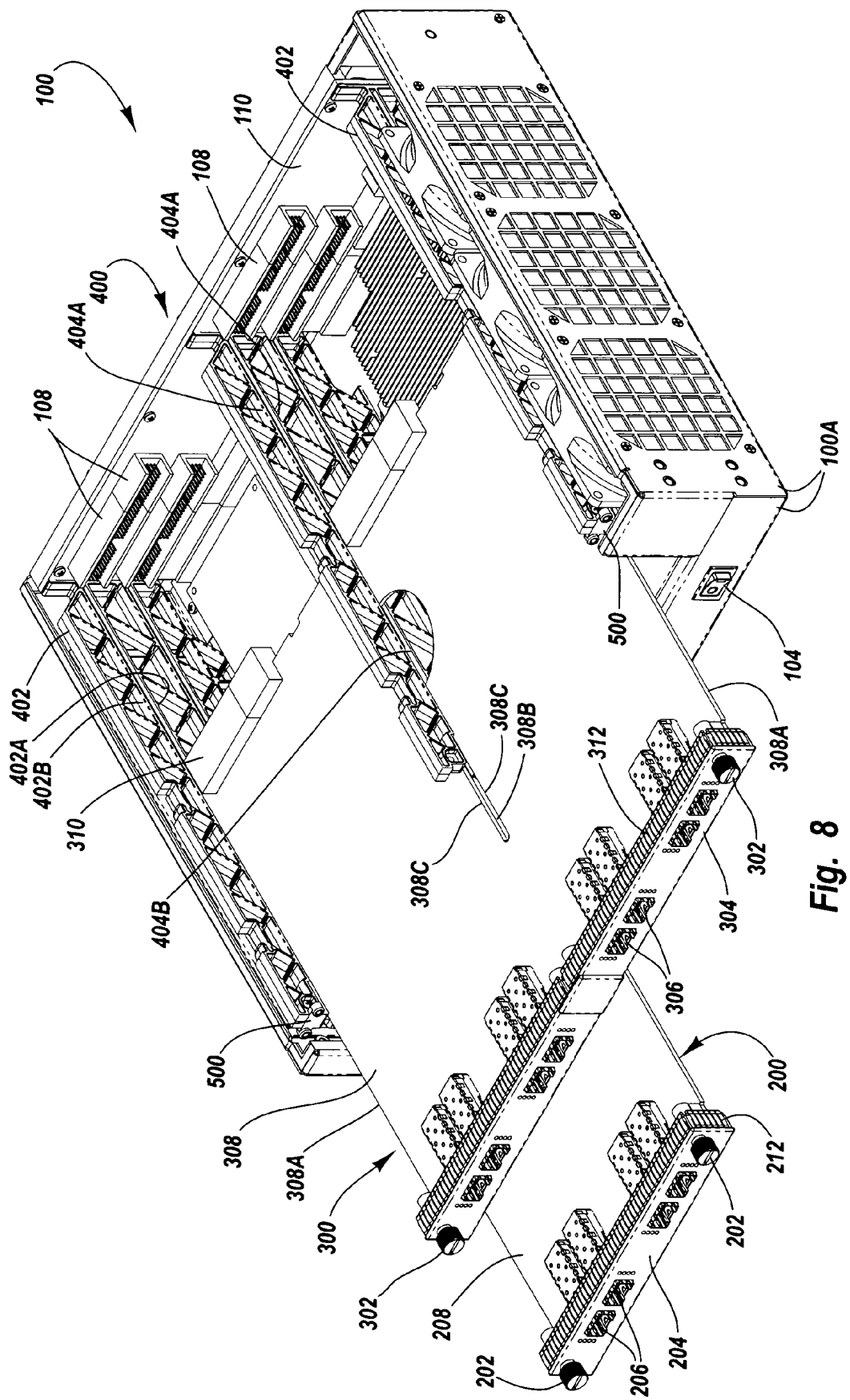
FIG. 8 is a perspective view illustrating an exemplary combination of single-wide and double-wide functional modules within an electronic equipment enclosure, the card of the double-wide functional module having a portion cut away to reveal aspects of the relation between a card edge and the card guide.

In particular, FIG. 8 indicates an exemplary arrangement wherein a double-wide functional module 300 is positioned in the card cage system 400 of the electronic equipment enclosure 100 simultaneously with one or more single-wide functional modules 200. As suggested by the discussion of FIGS. 6 and 7, the exemplary arrangement illustrated in FIG. 8 may generally be achieved by positioning adapter elements 500 in each of the card guides at the lower card storage level, so as to permit a side-by-side installation of two single-wide functional modules 200 at that level.

At the upper card storage level of card cage system, adapter elements 500 are positioned in the end card guides 402, but not in the middle card guide 404. As noted earlier, this configuration of the card cage system 400 permits a double-wide, or larger, card to be inserted into, and supported by, the card cage system 400.

The capability of card cage system 400 to accommodate one or more such double-wide, or larger, cards either alone or in combination with functional modules having other variously sized cards is useful because it permits implementation of a relatively higher level of functionality, by virtue of the double-wide or larger card configuration, even in those electronic equipment enclosures that are subject to relatively restrictive dimensions or form factors, such as a 2 U height equipment enclosure for example. Moreover, such aspects of card cage system 400 eliminate the need, in many cases, for the connecting cables or other devices, that might otherwise be required to establish communication between two related, but separate, single-wide cards.

As suggested by the disclosure herein concerning exemplary embodiments of the adapter element as selectively employed in connection with a card cage, the presence of one or more adapter elements in the card cage has various useful implications, and the same is likewise true with respect to the absence of adapter elements from one or more card guides of the card cage. Examples of such implications are considered below.

With respect to the former case, where one or more adapter elements are present in the card cage, the installed adapter elements provide, among other things, a mounting point for the fasteners of the functional module. In addition, the channels defined on either side of the installed adapter elements serve to guide the edge of a single wide functional module as the single wide functional module is inserted into the card cage.

In the latter situation, the absence of the adapter element from the middle card guide, for example, means that the receptacle defined by the middle card guide is available to accommodate a double wide or larger functional module. Moreover, the absence of an adapter element from the middle card guide and the elimination of the center mounting fasteners from a double wide or larger functional module means that more space on the front panel is thus made available for connectors, indicators or other components.

Thus, embodiments of the invention provide for, among other things, a relatively more efficient card storage system, while also providing for a high degree of flexibility in terms of the card storage arrangements that may be implemented. Moreover, embodiments of the card cage system also contribute to the ease with which such implementation may be achieved.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A card cage system for an electronic equipment enclosure, the card cage system suitable for use with one or more functional modules that each include a corresponding card joined to a front panel that includes fasteners, and the card cage system comprising:
   (a) first and second end card guides disposed within the electronic equipment enclosure;
   (b) a middle card guide interposed between the first and second end card guides in a spaced apart arrangement and cooperating with the first and second end card guides to define at least one card storage level; and
   (c) first and second adapter elements joined to the first and second end card guides, respectively, and a third adapter element configured to be removably joined to the middle card guide, the adapter elements cooperating with the card guides so that a first card storage configuration is defined when the adapter elements are joined to the corresponding card guides, and a second card storage configuration being defined when adapter elements are present in only two of the card guides.

2. The card cage system as recited in claim 1, wherein the second card storage configuration is defined when adapter elements are present only in the first and second end card guides.

3. The card cage system as recited in claim 1, wherein the first and second end card guides and the middle card guide cooperate to define two card storage levels.

4. The card cage system as recited in claim 1, wherein in the first card storage configuration, the middle card guide and end card guides are collectively configured to receive, at the at least one card storage level, only cards with dimensions conforming to a first card size, and wherein in the second card storage configuration, the middle card and end card guides are collectively configured to receive, at the at least one card storage level, only cards with dimensions conforming to a second card size.

5. The card cage system as recited in claim 1, wherein in the first card storage configuration, the middle card guide and end card guides are collectively configured to receive, at the at least one card storage level, only single-wide cards.

6. The card cage system as recited in claim 1, wherein in the second card storage configuration, the middle card guide and end card guides are collectively configured to receive, at the at least one card storage level, only cards wider than single-wide cards.

7. The card cage system as recited in claim 1, wherein the first and second end card guides and the middle card guide are substantially identical.

8. The card cage system as recited in claim 1, wherein in the first card storage configuration, the middle card guide and end card guides are collectively configured to receive, at the at least one card storage level, at least one double height or larger card.

9. The card cage system as recited in claim 1, wherein the first and second adapter elements are integral with the first and second end card guides, respectively.

10. The card cage system as recited in claim 1, wherein the first and second adapter elements are configured to be removably joined to the first and second end card guides, respectively.

11. The card cage system as recited in claim 1, wherein the card guides each define at least one channel configured to receive a portion of an edge of a functional module card.

12. The card cage system as recited in claim 1, wherein the adapter elements each define at least one channel configured to receive a portion of an edge of a functional module card.

13. The card cage system as recited in claim 1, wherein the adapter elements are each configured to engage at least one fastener of one of the functional modules.

14. The card cage system as recited in claim 1, further comprising means for substantially preventing relative motion of the adapter elements when the adapter elements are fastened to the card guides.

15. The card cage system as recited in claim 1, wherein the third adapter element removably obstructs a slot in the middle card guide thereby preventing a double wide or greater card from being received by the slot.

16. A card cage system for an electronic equipment enclosure, the card cage system suitable for use with one or more functional modules that each include a corresponding card, and the card cage system comprising:
   (a) first and second end card guides disposed within the electronic equipment enclosure;
   (b) a middle card guide interposed between the first and second end card guides in a spaced apart arrangement and cooperating with the first and second end card guides to define at least one card storage level; and
   (c) means for facilitating definition of multiple card storage configurations, the means for facilitating definition of multiple card storage configurations facilitating definition of first and second card storage configurations at the at least one card storage level.

17. The card cage system as recited in claim 16, wherein in the first card storage configuration the middle card guide and end card guides are collectively configured to receive, at the at least one card storage level, only cards of a first card size, and wherein in the second card storage configuration, the middle card guide and end card guides are collectively configured to receive, at the at least one card storage level, only cards of a second card size.

18. The card cage system as recited in claim 16, wherein the means for changing a card storage configuration aids in the retention of at least one card at the at least one card storage level.

19. The card cage system as recited in claim 16, wherein the means for changing a card storage configuration supports a received card in the first card storage configuration.

20. The card cage system as recited in claim 16, wherein in the first card storage configuration, the means for changing a card storage configuration permits the card guides to receive cards of a first card size, and prevents the card guides from receiving cards of a second card size.

21. The card cage system as recited in claim 16, wherein the means for changing a card storage configuration comprises an adapter element configured to be removably joined to the middle card guide.

22. The card cage system as recited in claim 16, wherein the means for facilitating definition of multiple card storage configurations further comprises:
a removable adapter configured to block a slot in the middle card guide, wherein the at least one card storage level is configured to receive single width cards when the adapter is attached to the middle card guide, and wherein the at least one card storage level is configured to receive double width or greater cards when the adapter is not attached to the middle card guide.

23. A card guide for use in an electronic equipment enclosure configured to receive one or more functional modules, each of which includes a corresponding card, the card guide having first and second sides and first and second ends and comprising:
(a) first and second support structures that cooperate to at least partially define a pair of channels configured to receive at least a portion of a card, one channel being located on either side of the card guide, the channels terminating short of the first end of the card guide so that a slot is defined that is interposed between the first and second support structures, and the first and second support structures further cooperating to define a receptacle in communication with the slot so that in a first card storage configuration, a card received in the electronic equipment enclosure by way of the receptacle is positioned in the slot such that the card straddles the card guide;
(b) a connecting member at least indirectly joined to one of the first and second support structures.

24. The card guide as recited in claim 23, wherein a second card storage configuration is defined when the receptacle is blocked, so that straddling of the card guide by a card received in the electronic equipment enclosure is substantially prevented.

25. The card guide as recited in claim 24, wherein in at least the second card storage configuration, the first and second support structures are collectively configured to receive, in each of the channels, respective portions of first and second cards positioned in the electronic equipment enclosure in a side-by-side arrangement.

26. The card guide as recited in claim 23, further comprising a third support structure, the first, second and third support structures cooperating to at least partially define two card storage levels.

27. The card guide as recited in claim 23, wherein at least one of the support structures comprises a web structure.

28. The card guide as recited in claim 23, further comprising a positioning member at least indirectly attached to one of the support structures.

29. The card guide as recited in claim 23, wherein the card guide substantially comprises injection-molded plastic.

30. The card guide as recited in claim 23, wherein the receptacle is configured to removably receive an adapter element, selective use of the adapter element facilitating definition of the first and second card storage configurations.

31. The card guide as recited in claim 23, wherein the card guide is configured for use in both vertical and horizontal card cages.

32. An electronic equipment enclosure, comprising:
(a) a chassis; and
(b) a card cage system substantially disposed within the chassis and comprising:
the card cage system comprising:
(i) first and second end card guides;
(ii) a middle card guide interposed between the first and second end card guides in a spaced apart arrangement and cooperating with the first and second end card guides to define at least one card storage level; and
(iii) first and second adapter elements joined to the first and second end card guides, respectively, and a third adapter element configured to be removably joined to the middle card guide, the adapter elements cooperating with the card guides so that a first card storage configuration is defined when the adapter elements are joined to the corresponding card guides, and a second card storage configuration being defined when adapter elements are present in only two of the card guides.

33. The electronic equipment enclosure as recited in claim 32, wherein the second card storage configuration is defined when adapter elements are present only in the first and second end card guides.

34. The electronic equipment enclosure as recited in claim 32, wherein the first and second end card guides and the middle card guide cooperate to define two card storage levels.

35. The electronic equipment enclosure as recited in claim 32, wherein in the first card storage configuration, the middle card guide and end card guides are collectively configured to receive, at the at least one card storage level, only cards with dimensions conforming to a first card size, and wherein in the second card storage configuration, the middle card and end card guides are collectively configured to receive, at the at least one card storage level, only cards with dimensions conforming to a second card size.

36. The electronic equipment enclosure as recited in claim 32, wherein in the first card storage configuration, the middle card guide and end card guides are collectively configured to receive, at the at least one card storage level, only single-wide cards.

37. The electronic equipment enclosure as recited in claim 32, wherein in the second card storage configuration, the middle card guide and end card guides are collectively configured to receive, at the at least one card storage level, only cards wider than single-wide cards.

38. The electronic equipment enclosure as recited in claim 32, further comprising a functional module configured to be received at the at least one card storage level when the first card storage configuration is defined.

39. The electronic equipment enclosure as recited in claim 32, further comprising a functional module configured to be received at the at least one card storage level when the second card storage configuration is defined.

40. The electronic equipment enclosure as recited in claim 32, wherein the card cage comprises one of: a vertical card cage; and, a horizontal card cage.

41. The electronic equipment enclosure as recited in claim 32, further comprising means for substantially preventing relative motion of the adapter elements when the adapter elements are fastened to the card guides.

42. The electronic equipment enclosure as recited in claim 32, wherein the card cage is configured to receive at least one of: a double height or larger functional module; and, a double wide or wider functional module.

43. The electronic equipment enclosure as recited in claim 32, wherein reconfiguration of the card cage can be achieved without disassembling the chassis.

44. The electronic equipment enclosure as recited in claim 32, wherein the third adapter is configured to prevent double-wide or greater cards from being received at the at least one card storage level when the third adapter is removably joined to the middle card guide, and wherein the third adapter is configured to provide at least one channel for guiding a single width card when the adapter is removably joined to the middle card guide.

* * * * *

UNITED STATES PATENT AND TRADEMARK OFFICE
CERTIFICATE OF CORRECTION

PATENT NO. : 7,167,380 B2 Page 1 of 1
APPLICATION NO. : 10/638981
DATED : January 23, 2007
INVENTOR(S) : Donald A. Ice It is certified that error appears in the above-identified patent and that said Letters Patent is hereby corrected as shown below:

Title Page
Item 56, Page 2, OTHER PUBLICATIONS, Line 4, change "Cocumentation" to --Documentation--

Column 6
Line 61, change "such as" to --which--
Line 62, change "with the with" to --with--

Signed and Sealed this

Thirtieth Day of March, 2010

David J. Kappos
*Director of the United States Patent and Trademark Office*